(12) United States Patent
Anthony

(10) Patent No.: US 6,373,673 B1
(45) Date of Patent: *Apr. 16, 2002

(54) MULTI-FUNCTIONAL ENERGY CONDITIONER

(75) Inventor: Anthony A. Anthony, Erie, PA (US)

(73) Assignee: X2Y Attenuators, LLC, Santa Monica, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/579,606

(22) Filed: May 26, 2000

Related U.S. Application Data

(63) Continuation-in-part of application No. 09/600,530, filed as application No. PCT/US99/01040 on Jan. 16, 1999, application No. 09/579,606, which is a continuation-in-part of application No. 09/460,218, filed on Dec. 13, 1999, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.

(60) Provisional application No. 60/136,451, filed on May 28, 1999, provisional application No. 60/139,182, filed on Jun. 15, 1999, provisional application No. 60/146,987, filed on Aug. 3, 1999, provisional application No. 60/165,035, filed on Nov. 12, 1999, provisional application No. 60/180,101, filed on Feb. 3, 2000, provisional application No. 60/185,320, filed on Feb. 28, 2000, provisional application No. 60/200,327, filed on Apr. 28, 2000, and provisional application No. 60/203,863, filed on May 12, 2000.

(51) Int. Cl.[7] .............................................. H02H 9/00

(52) U.S. Cl. ........................ 361/117; 361/56; 361/111; 361/119

(58) Field of Search ........................ 361/56, 111, 119, 361/58, 127, 117

(56) References Cited

U.S. PATENT DOCUMENTS

| 3,842,374 A | 10/1974 | Schlicke |
| 4,262,317 A | 4/1981 | Baumbach |
| 4,335,417 A | 6/1982 | Sakshaug et al. |

(List continued on next page.)

FOREIGN PATENT DOCUMENTS

| DE | 198 57 043 C1 | 3/2000 |
| JP | 3-18112 | 1/1991 |
| JP | 6-53048 | 2/1994 |

(List continued on next page.)

OTHER PUBLICATIONS

PCT International Search Report for International Application No. PCT/US/98/06962 Aug. 19, 1998.
PCT International Search Report for International Application No. PCT/US99/01040 Apr. 19, 1999.
PCT International Search Report for International Application No. PCT/US99/07653 Jul. 19, 1999.
PCT International Search Report for International Application No. PCT/US00/11409 Sep. 18, 2000.
PCT International Search Report for International Application No. PCT/US00/14626 Sep. 13, 2000.
PCT International Search Report for International Application No. PCT/US00/16518 Nov. 8, 2000.

*Primary Examiner*—Stephen W. Jackson
(74) *Attorney, Agent, or Firm*—Hahn Loesser & Parks, LLP

(57) ABSTRACT

The present invention relates to a multi-functional energy conditioner having architecture employed in conjunction with various dielectric and combinations of dielectric materials to provide one or more differential and common mode filters for the suppression of electromagnetic emissions and surge protection. The architecture allows single or multiple components to be assembled within a single package such as an integrated circuit or connector. The component's architecture is dielectric independent and provides for integration of various electrical characteristics within a single component to perform the functions of filtering, decoupling, fusing and surge suppression.

19 Claims, 14 Drawing Sheets

U.S. PATENT DOCUMENTS

| | | | |
|---|---|---|---|
| 4,682,129 | A | 7/1987 | Bakermans et al. |
| 4,772,225 | A | 9/1988 | Ulery |
| 4,587,589 | A | 5/1989 | Marek |
| 5,079,069 | A | 1/1992 | Howard et al. |
| 5,140,497 | A | 8/1992 | Kato et al. |
| 5,142,430 | A | 8/1992 | Anthony |
| 5,155,655 | A | 10/1992 | Howard et al. |
| 5,161,086 | A | 1/1993 | Howard et al. |
| 5,181,859 | A | 1/1993 | Foreman et al. |
| 5,236,376 | A | 8/1993 | Cohen |
| 5,243,308 | A | 9/1993 | Shusterman et al. |
| 5,251,092 | A | 10/1993 | Brady et al. |
| 5,261,153 | A | 11/1993 | Lucas |
| 5,268,810 | A | 12/1993 | DiMarco et al. |
| 5,290,191 | A | 3/1994 | Foreman et al. |
| 5,321,373 | A | 6/1994 | Shusterman et al. |
| 5,321,573 | A | 6/1994 | Person et al. |
| 5,337,028 | A | 8/1994 | White |
| 5,353,189 | A | 10/1994 | Tomlinson |
| 5,396,201 | A | 3/1995 | Ishizaki et al. |
| 5,414,587 | A | 5/1995 | Kiser et al. |
| 5,455,734 | A | 10/1995 | Foreman et al. |
| 5,483,407 | A | 1/1996 | Anastasio et al. |
| 5,500,629 | A | 3/1996 | Meyer |
| 5,512,196 | A | 4/1996 | Mantese et al. |
| 5,555,150 | A | 9/1996 | Newman et al. |
| 5,568,348 | A | 10/1996 | Foreman et al. |
| 5,592,391 | A | 1/1997 | Muyshondt et al. |
| 5,751,539 | A | 5/1998 | Stevenson et al. |
| 5,828,093 | A | 10/1998 | Naito et al. |
| 5,838,216 | A | 11/1998 | White et al. |
| 5,880,925 | A | 3/1999 | DuPre et al. |
| 5,889,445 | A | 3/1999 | Ritter et al. |
| 5,909,350 | A | 6/1999 | Anthony |
| 6,018,448 | A * | 1/2000 | Anthony .................. 361/56 |
| 6,034,864 | A | 3/2000 | Naito et al. |
| 6,038,121 | A | 3/2000 | Naito et al. |
| 6,072,687 | A | 6/2000 | Naito et al. |
| 6,097,581 | A | 8/2000 | Anthony |

FOREIGN PATENT DOCUMENTS

| | | |
|---|---|---|
| JP | 6-53049 | 2/1994 |
| JP | 6-53075 | 2/1994 |
| JP | 6-53077 | 2/1994 |
| JP | 6-53078 | 2/1994 |
| JP | 6-84695 | 3/1994 |
| JP | 6-151014 | 5/1994 |
| JP | 6-151244 | 5/1994 |
| JP | 6-151245 | 5/1994 |
| JP | 6-325977 | 11/1994 |
| JP | 7-235406 | 9/1995 |
| JP | 7-235852 | 9/1995 |
| JP | 7-240651 | 9/1995 |
| JP | 8-124795 | 5/1996 |
| JP | 8-172025 | 7/1996 |
| JP | 11-214256 | 8/1999 |
| WO | 00/16446 | 3/2000 |

* cited by examiner

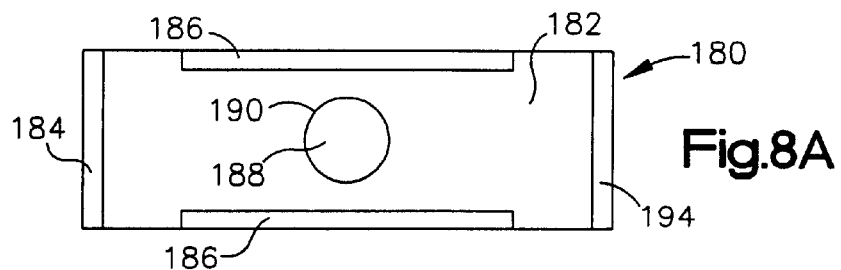
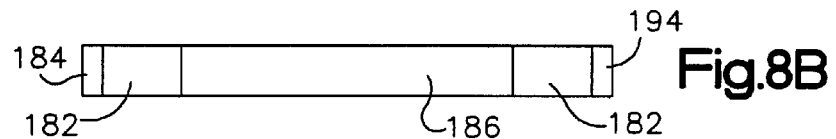
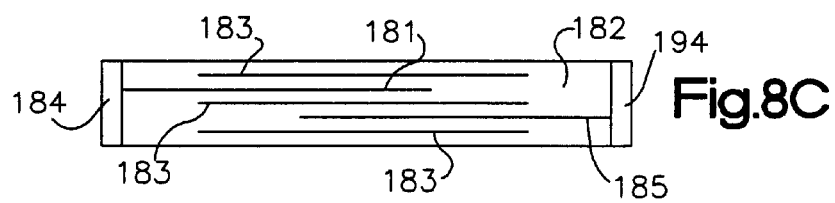
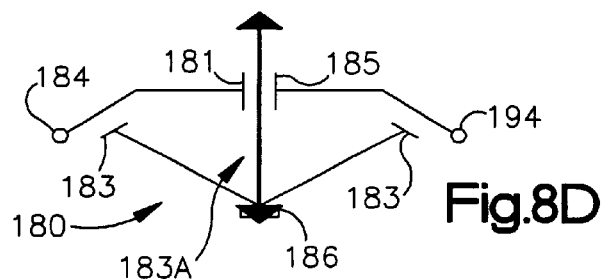
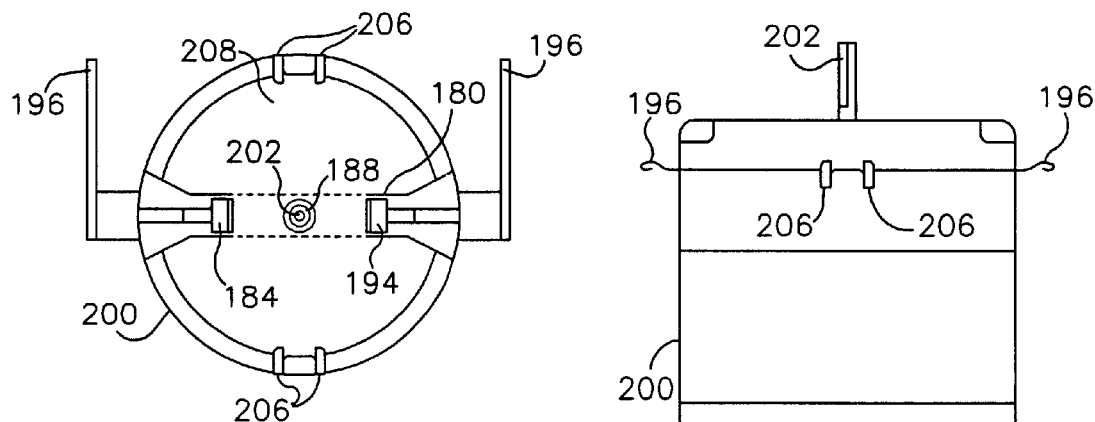

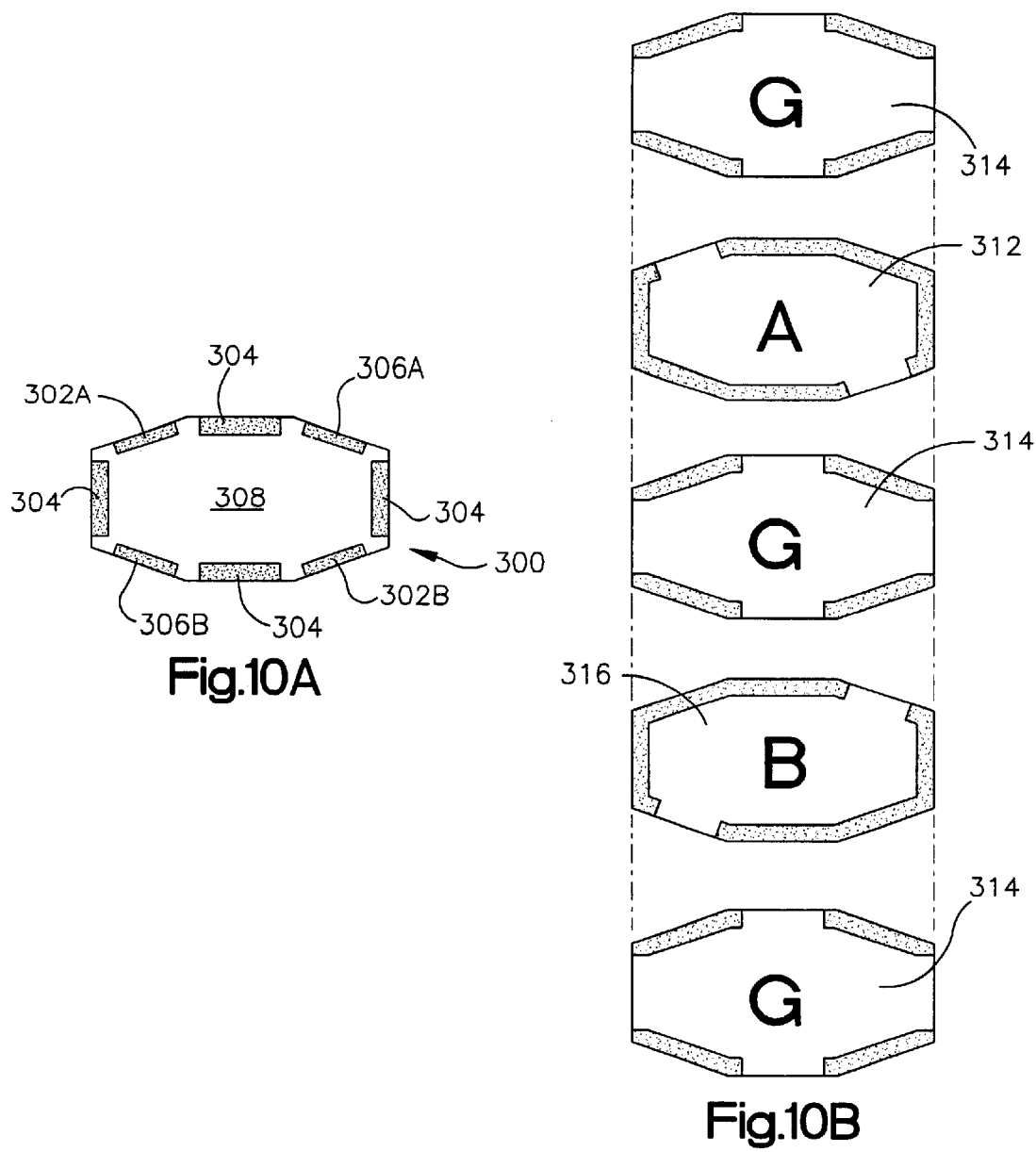
Fig.10A
Fig.10B
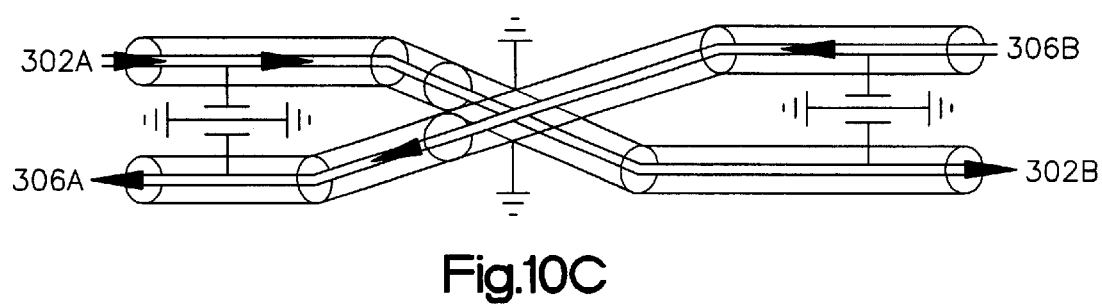
Fig.10C

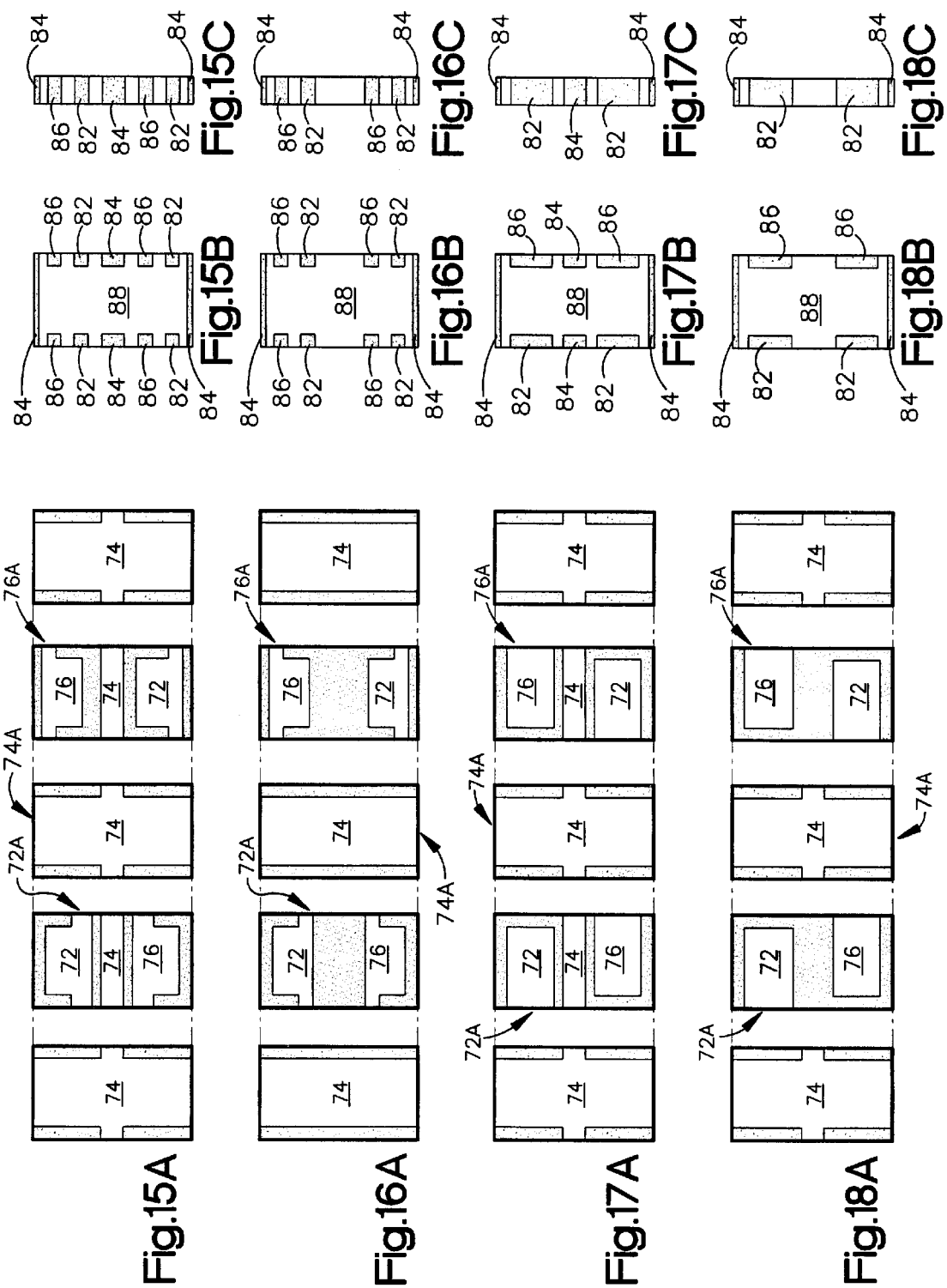

MULTI-FUNCTIONAL ENERGY CONDITIONER

This application is a continuation-in-part of co-pending application Ser. No. 09/600,530 filed Jul. 18, 2000, which is a U.S. national stage application of international application PCT/US99/01040 filed Jan. 16, 1999; this application is also a continuation-in-part of co-pending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350. This application also claims the benefit of U.S. Provisional Application No. 60/136,451 filed May 28, 1999, U.S. Provisional Application No. 60/139,182 filed Jun. 15, 1999, U.S. Provisional Application No. 60/146,987 filed Aug. 3, 1999, U.S. Provisional Application No. 60/165,035 filed Nov. 12, 1999, U.S. Provisional Application No. 60/180,101 filed Feb. 3, 2000, and U.S. Provisional Application No. 60/185,320 filed Feb. 28, 2000, U.S. Provisional Application No. 60/200,327 filed Apr. 28, 2000, and U.S. Provisional Application No. 60/203,863 filed May 12, 2000.

TECHNICAL FIELD

BACKGROUND OF THE INVENTION

The present invention relates to a multi-functional energy conditioner that possesses a commonly shared centrally located conductive electrode of the structure that can simultaneously interact with energized and paired differential electrodes as said differential electrodes operate with respect to each other in a oppositely phased or charged manner.

The majority of electronic equipment produced presently includes miniaturized active components and circuitry to perform high-speed functions and utilize high speed electrical interconnections to propagate power and data between critical components. These components can be very susceptible to stray electrical energy created by electromagnetic interference or voltage transients occurring on electrical circuitry servicing or utilizing these systems. Voltage transients can severely damage or destroy such micro-electronic components or contacts thereby rendering the electronic equipment inoperative, often requiring extensive repair and/or replacement at a great cost.

Electrical interference in the form of EMI, RFI and capacitive and inductive parasitics can be created or induced into electrical circuitry and components from such sources as radio broadcast antennas or other electromagnetic wave generators. EMI can also be generated from the electrical circuit, which makes shielding from EMI desirable. Differential and common mode currents are typically generated in cables and on circuit board tracks. In many cases, fields radiate from these conductors which act as antennas. Controlling these conducted/radiated emissions is necessary to prevent interference with other circuitry that is sensitive to the unwanted noise. Other sources of interference are also generated from equipment as it operates, coupling energy to the electrical circuitry, which may generate significant interference. This interference must be eliminated to meet international emission and/or susceptibility requirements.

Transient voltages can be induced by lightning on electrical lines producing extremely large potentials in a very short time. In a similar manner, electromagnetic pulses (EMP) can generate large voltage spikes with fast rise time pulses over a broad frequency range that are detrimental to most electronic devices. Other sources of large voltage transients as well as ground loop interference caused by varying ground potentials can disrupt an electrical system. Existing protection devices are unable to provide adequate protection in a single integrated package. Varieties of filter and surge suppression circuit configurations have been designed as is evident from the prior art. A detailed description of the various inventions in the prior art is disclosed in U.S. Pat. No. 5,142,430, herein incorporated by reference.

The '430 patent itself is directed to power line filter and surge protection circuit components and the circuits in which they are used to form a protective device for electrical equipment. These circuit components comprise wafers or disks of material having desired electrical properties such as varistor or capacitor characteristics. The disks are provided with electrode patterns and insulating bands on the surfaces thereof, which coact with apertures, formed therein, so as to electrically connect the components to electrical conductors of a system in a simple and effective manner. The electrode pattern coact with one another to form common electrodes with the material interposed between. The '430 patent was primarily directed toward filtering paired lines. Electrical systems have undergone short product life cycles over the last decade. A system built just two years ago can be considered obsolete to a third or fourth generation variation of the same application. Accordingly, componentry and circuitry built into these the systems need to evolve just as quickly.

The performance of a computer or other electronic systems has typically been constrained by the speed of its slowest active elements. Until recently, those elements were the microprocessor and the memory components that controlled the overall system's specific functions and calculations. However, with the advent of new generations of microprocessors, memory components and their data, there is intense pressure to provide the user increased processing power and speed at a decreasing unit cost. As a result, the engineering challenge of conditioning the energy delivered to electrical devices has become both financially and technologically difficult. Since 1980, the typical operating frequency of the mainstream microprocessors has increased approximately 240 times, from 5 MHz (million cycles per second) to approximately to 1200 MHz+ by the end of the year 2000. Processor speed is now matched by the development and deployment of ultra-fast RAM architectures. These breakthroughs have allowed boosting of overall system speeds past the 1 GHz mark. During this same period, passive componentry technologies have failed to keep up and have produced only incremental changes in composition and performance. Advances in passive component design changes have focused on component size reduction, slight modifications of discrete component electrode layering, new dielectric discoveries, and modifications of manufacturing production techniques that decrease component production cycle times.

In the past, passive component engineers have solved design problems by increasing the number of components in the electrical circuit. These solutions generally involved adding inductors and resistors that are used with capacitors to filter and decouple.

Not to be overlooked, however, is the existence of a major limitation in the line conditioning ability of a single passive component and for many passive component networks. This limitation presents an obstacle for technological progression and growth in the computer industry and remains as one of the last remaining challenges of the +GHz speed system. This constraint to high-speed system performance is centered upon the limitations created by the supporting passive componentry that delivers and conditions energy and data signals to the processors, memory technologies, and those systems located outside of a particular electronic system.

The increased speed of microprocessors and memory combinations has resulted in another problem as evidenced by recent system failures that have occurred with new product deployments of high-speed processors & new memory combinations by major OEMs. The current passive component technology is the root cause of many of these failures and delays. The reasons are that the operating frequency of a single passive component generally has a physical line conditioning limitation of between 5 and 250 MHz. Higher frequencies for the most part require combinations of passive elements such as discrete L-C-R, L-C, R-C networks to shape or control energy delivered to the system load. At frequencies above 200 MhZ, prior art, discrete L-C-R, L-C, R-C networks begin to take on characteristics of transmission lines and even microwave-like features rather than providing lump capacitance, resistance or inductance that such a network was designed for. This performance disparity between the higher operating frequency of microprocessors, clocks, power delivery bus lines and memory systems and that of the supporting passive elements has resulted in system failures.

Additionally, at these higher frequencies, energy pathways are normally grouped or paired as an electrically complementary element or elements that electrically and magnetically must work together in harmony and balance. An obstacle to this balance is the fact that two discrete capacitors manufactured in the same production batch can easily posses a variability in capacitance, ranging anywhere from 15%–25%. While it is possible to obtain individual variations of capacitance between discrete units of less than 10%, a substantial premium must be paid to recover the costs for testing, hand sorting manufactured lots, as well as the additional costs for the more specialized dielectrics and manufacturing techniques that are needed to produce these devices with reduced individual variance differences required for differential signaling. Therefore, in light of the foregoing deficiencies in the prior art, the applicant's invention is herein presented.

SUMMARY OF THE INVENTION

Based upon the foregoing, there has been found a need to provide a multi-functioning electronic component which can operate across a broad frequency range as compared to a single, prior art component or a multiple passive network. Ideally, this component would perform effectively past 1 GhZ while simultaneously providing energy decoupling for active componentry and maintaining a constant apparent voltage potential for portions of active circuitry. This new component would also minimize or suppress unwanted electromagnetic emissions resulting from differential and common mode currents flowing within electronic circuits. A multi-functioning electronic component in a multi-layered embodiment and in a dielectric independent passive architecture can, when attached into circuitry and energized, be able to provide simultaneous line conditioning functions such as, but not limited to, the forgoing needs. These needs include source to load and/or load to source decoupling, as well as, differential and common mode filtering, parasitic containment, and surge protection in one integrated package when utilizing an external conductive area or pathway. The invention can be utilized for protecting electronic circuitry and active electronic components from electromagnetic field interference (EMI), over voltages, and preventing debilitating electromagnetic emissions attributed to the circuitry and from the invention itself. Furthermore, the present invention minimizes or prevents detrimental parasitics from coupling back on to a host circuit from internally enveloped differential conductive elements located with the invention as it operates in an energized circuit. More specifically, this invention teaches that with proper placement techniques and attachment into circuitry, the system can utilize the energized physical architecture to suppresses unwanted electromagnetic emissions, both those received from other sources, and those created internally within the invention and it's electronic circuitry that could potentially result in differential and common mode currents that would be contributed as parasitics back into the host circuitry.

In addition, due to the multi-functional energy conditioner's physically integrated, shield-containment conductive electrode architecture, the ability to use an independent electrode material and/or an independent dielectric material composition when manufactured will not limit the invention to a specific form-shape, size for the multitude of possible embodiments of the invention that can be created and of which only a few will be described, herein.

Due to the highly competitive nature of today's electronic industry, such a multi-functional energy conditioner/surge protector must be inexpensive, miniaturized, low in cost, highly integrated for incorporation into a plurality of electronic products. It would be desirable if it could operate free of any additional discrete passive components to achieve the desired filtering and/or line conditioning that prior art components are unable to provide.

It is therefore a main object of the invention to provide an easily manufactured, adaptable, multi-functional electronic component that prevents or suppresses electromagnetic emissions caused by differential and common mode currents that are generated among paired energy pathways.

It is another object of the invention to provide a protective circuit arrangement that may be mass produced and adaptable to include one or more protective circuits in one component package to provide protection against voltage transients, over voltages, parasitic sand electromagnetic interference.

It is another object of the invention to provide a discrete, multi-functioning electronic component, that when attached to an external conductive pathway or surface could operate effectively across a broad frequency range and could simultaneously provide energy decoupling for active circuit componentry while maintaining a constant apparent voltage potential for portions of circuitry.

Another object of the invention is to provide a blocking circuit or circuits utilizing an inherent ground which is combined with an external conductive surface or ground area that provides an additional energy pathway from the paired differential conductors for attenuating EMI and over voltages without having to couple the hybrid electronic component to a final earth ground.

Another object of the invention is to provide a single device that eliminates the need to use specialized dielectrics commonly used to obtain a minimized degree of variation of capacitance between internal capacitor plates.

These and other objects and advantages of the invention are accomplished through the use of a plurality of common conductive plates that are joined and partially surrounding corresponding differentially conductive electrode plates that are separated by a material that exhibits any one or a combination of a number of predetermined electrical properties.

Other objects and advantages of the invention are accomplished by coupling pairs of conductors into an area or space partially enveloped by a plurality of joined common conductive plates and by selectively coupling external conductors or pathways to differential electrode plates.

It is another object of the invention to provide line-to-line and line-to-ground capacitive or inductive coupling between internal plates and/or conductive electrodes that create a state of effective differential and common mode electromagnetic interference filtering and/or surge protection. Additionally, a circuit arrangement utilizing the invention will comprise of at least one line conditioning circuit component constructed as a plate. Electrode patterns are provided on one surface of the plate and the electrode surfaces are then electrically coupled to electrical conductors of the circuit. The electrode patterns, dielectric material employed and common conductive plates produce commonality between electrodes for the electrical conductors producing a balanced (equal but opposite) circuit arrangement with an electrical component coupled line-to-line between the electrical conductors and line-to-ground from the individual electrical conductors. The particular electrical effects of the multi-functional energy conditioner are determined by the choice of material between the electrode plates and the use of ground shields which effectively house the electrode plates within one or more created Faraday like shield cages. If one specific dielectric material is chosen, the resulting multi-functional energy conditioner will be primarily a capacitive arrangement. The dielectric material in conjunction with the electrode plates and common conductive plates will combine to create a line-to-line capacitor that is approximately ½ the value of the capacitance of the two line-to-ground capacitors make up an attached and energized invention. If a metal oxide varistor (MOV) material is used, then the multi-functional energy conditioner will be a capacitive multi-functional energy conditioner with over current and surge protection characteristics provided by the MOV-type material. The common conductive plates and electrode plates will once again form line-to-line and line-to-ground capacitive plates, providing differential and common mode filtering accept in the case of high transient voltage conditions. During these conditions, the MOV-type varistor material, which is essentially a nonlinear resistor used to suppress high voltage transients, will take effect to limit the voltage that may appear between the electrical conductors.

In a further embodiment, a ferrite material may be used adding additional inherent inductance to the multi-functional energy conditioner arrangement. As before, the common ground conductive and electrode plates form line-to-line and line-to-ground capacitive plates with the ferrite material adding inductance to the arrangement. Use of the ferrite material also provides transient voltage protection in that it to will become conductive at a certain voltage threshold allowing the excess transient voltage to be shunted to the common conductive plates, effectively limiting the voltage across the electrical conductors. Numerous other arrangements and configurations are also disclosed which implement and build on the above objects and advantages of the invention to demonstrate the versatility and wide spread application of multi-functional energy conditioners within the scope of the present invention.

BRIEF DESCRIPTION OF THE DRAWINGS

FIG. 8 shows a further alternative embodiment of the multi-functional energy conditioner configured for use with electric motors; FIG. 8A shows a top plan view of the motor multi-functional energy conditioner embodiment; FIG. 8B shows a side elevation view of the same; FIG. 8C shows a side elevation view in cross-section of the same; and FIG. 8D is a schematic representation of the physical embodiment of the multi-functional energy conditioner shown in FIG. 8A;

FIG. 9 shows the motor multi-functional energy conditioner utilizing one attachment embodiment electrically and physically coupled to an electric motor; FIG. 9A shows a top plan view of the multi-functional energy conditioner coupled to a motor and FIG. 9B shows a side elevation view of the same;

FIG. 10A is a top plan view of a shielded twisted pair feed through multi-functional energy conditioner; and FIG. 10B is a top plan view of the generally parallel elements that comprise the shielded twisted pair feed through multi-functional energy conditioner of FIG. 10A; and FIG. 10C and FIG. 10D are schematic representations of a shielded twisted pair feed through multi-functional energy conditioner showing differential noise cancellation.

FIG. 15 shows a top plan view of the common conductive electrode shield plates and differential electrode plates which make up an alternate embodiment of the multi-functional energy conditioner placed in a cross-over, feed-through configuration with additional common shield isolator in accordance with the present invention followed by a composite top plan view and a composite side elevation view of the multi-functional energy conditioner;

FIG. 16 shows a top plan view of the common conductive electrode shield plates and differential electrode plates which make up an alternate embodiment of the multi-functional energy conditioner placed in a cross-over, feed-through configuration in accordance with the present invention followed by a composite top plan view and a composite side elevational view of the multi-functional energy conditioner;

FIG. 17 shows a top plan view of the common conductive electrode shield plates and differential electrode plates which make up an alternate embodiment of the multi-functional energy conditioner placed in a bypass configuration with additional common shield isolator in accordance with the present invention followed by a composite top plan view and a composite side elevational view of the multi-functional energy conditioner;

FIG. 18 shows a top plan view of the common conductive electrode shield plates and differential electrode plates which make up an alternate embodiment of the multi-functional energy conditioner placed in a bypass configuration with additional common shield isolator in accordance with the present invention followed by a composite top plan view and a composite side elevational view of the multi-functional energy conditioner;

DETAILED DESCRIPTION OF THE PREFERRED EMBODIMENT

Figure 1:
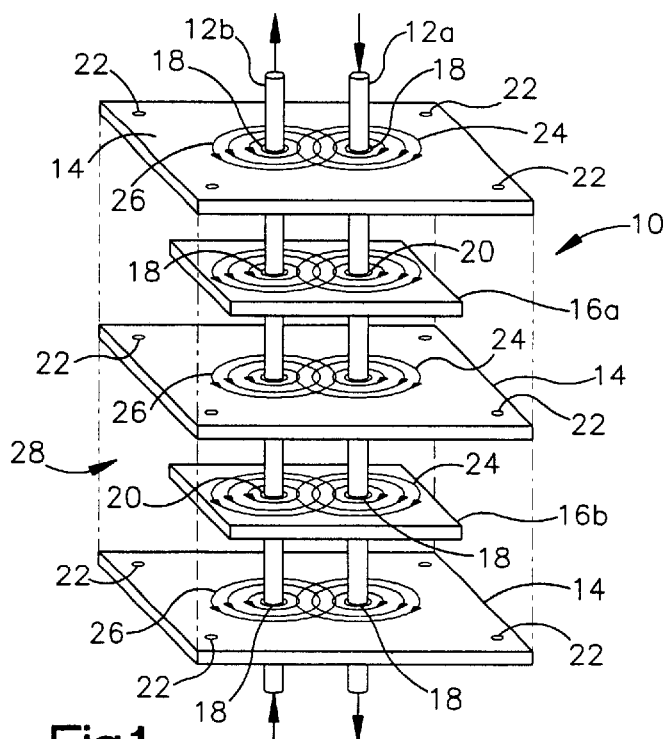
FIG. 1 shows an exploded perspective view of a multi-functional energy conditioner in accordance with the present invention.

Continued and increasing use of electronics in daily life and the amount of electromagnetic interference (EMI) and emissions generated has created new electromagnetic compatibility (EMC) requirements. These new specifications apply to diverse electronic equipment such as but not limited to and in particular IC (Integrated Circuit) packages, PCBs, DSPs, microcontrollers, switch mode power supplies, networks, connectors, avionics, wireless phones, consumer electronics, tools, ordnance igniters, and control equipment. The present invention is directed towards a physical architecture for an electronic component that provides simultaneous and effective EMI suppression; line conditioning, broadband I/O-line filtering, EMI decoupling noise reduction and surge protection in one integrated component or assembly.

To propagate electromagnetic interference energy two fields are required, an electric and magnetic. Electric fields couple energy into circuits through the voltage differential between two or more points. Changing electrical fields in a space give rise to a magnetic field. Any time-varying magnetic flux will give rise to an electric field. As a result, a purely electric or purely magnetic time-varying fields cannot exist independent of each other. Passive component architecture such as the invention can be built to condition or minimize both types of energy fields that can be found in an electrical system. The invention is not necessarily built to condition one type of field more than another, however, different types of materials can be added or used to build an embodiment that could do such specific conditioning upon one energy field over another.

The accumulation of an electric charge creates an electrostatic field and this accumulation can best be observed between two boundaries, one conductive and the other nonconductive. The boundary condition behavior referenced in Gauss's law causes a conductive enclosure or semi-enclosure called a Faraday cage or Faraday cage-like structure to act as an electrostatic shield in relationship to conductive elements contained or located partially inside the shield-like structure. Near the boundary of the shield structure, electrical charges and parasitics are for the most part kept inside of the shield boundary. In turn, the electrical charges and parasitics that exist on the outside of the cage-like shield boundary are excluded for the most part, from detrimentally affecting internally generated fields related to the conductors held within. Coupled electric and magnetic fields have the ability in nature to propagate along at the speed of light unless the energy field propagating along a conductive pathway meets with an impedance or resistance along said pathway that hinders the propagating field energy from doing so. This impedance or resistance contributes to the concept of "skin effect," which predicts the effectiveness of magnetic shielding in relationship to the materials that make up a conductive pathway.

As previously, noted, propagated electromagnetic interference can be the product of both electric and magnetic fields, respectively. Until recently, emphasis in the art has been placed upon on filtering EMI from circuit or energy conductors carrying high frequency noise with DC energy or current. However, the invention is capable of conditioning energy that uses DC, AC and AC/DC hybrid-type propagation of energy along conductive pathways found in an electrical system or test equipment. This includes use of the invention to condition energy in systems that contain many different types of energy propagation formats found in systems containing many kinds of circuitry propagation characteristics within the same electrical system platform. The main cause of radiated emission problems can be due to the two types of conducted currents, differential and common mode energy. The fields generated by these currents result in many types of EMI emissions. Differential mode (DM) currents are those currents that flow in a circular path in wires, circuit board traces and other conductors. The fields related to these currents originate from the loop defined by the conductors.

Higher operating frequencies of circuitry for the most part, require the user to develop combinations of single or multiple passive elements such as inductors, capacitors, or resistors to create L-C-R, L-C, and R-C discrete component networks used to control energy delivered to a system load. However, prior art, discrete, L-CR, L-C, R-C component networks at frequencies above 200 MhZ begin to take on characteristics of transmission lines, or can even exhibit microwave-like features at still higher frequencies. This can allow unsuppressed or undiminished parasitics, or the connection structures that combine externally between all of the discrete elements into said network, to degrade, slow down or otherwise contribute noticeable degradation of the energy propagating along the circuit over a wide range of frequency operations. This can be substantially harmful to the larger circuit said network is attached into. Rather than providing a lump capacitance, resistance or inductance that such a network was designed for, at higher frequencies, capacitive parasitics that are attributed to the internal electrodes located inside prior art component networks can be one of many reasons or sources of energy degradation, debilitation or sub-specified performance to the circuit. Said sub-par performance losses such as, but not limited to, data drop, line delays, etc. and can contribute to a measurable circuit in-efficiency.

Common mode and differential mode energies differ in that they propagate in different circuit paths. Common mode noise will can be caused electrostatic induction which results from un-equal capacitance between conductive pathways and the surroundings. Noise voltage developed, will be the same on both wires and/or, it can be caused by electromagnetic induction magnetic fields from a conductive pathway linking paired or multiple conductive pathways un-equally with any noise voltage developed, essentially, the same; on both paired, conductive pathways. Noise energy will travel on the outer skin surface of conductors. Differential noise, is normally created by voltage imbalance within an energized circuit, Interference that causes the potential of one side of the signal transmission path to be change relative to the other side.

To help reduce, minimize or suppress the unwanted noise, the energized invention utilizes a low impedance path that develops internally, within the invention to take portions of the unwanted energy to a conductive ground and/or an external (to the invention) conductive area or pathway. Portions of this pathway can also be located internally within the invention and include portions of the common conductive plates or the structure they make up. The common conductive plates or structure and the extension of the external conductive area created, will allow energy propagating along these conductive shield pathway elements to move to a larger, externally located conductive area, pathway or system ground that is situated primarily outside of the internally positioned common conductive plate area(s) or shield-like structure that make up portions of the invention.

Possible external connections and/or attachments of a plurality of invention common conductive pathways to pathways' external of the multilayer embodiment of the invention can be made by a multitude of possible industry accepted means know to the art. Such conductive attachments of common conductive plates or the attachments to a conductive shield-like structure that are made from a combination of these joined, common plate elements and to an external conductive pathway, separate, in most cases, from the differential conductive pathways, also conductively attached to the multi-functional energy conditioner will provide a shortening of the overall noise current loop area created in an energized circuit, also containing a source, multi-functional energy conditioner, conductive pathways and a load.

At least two energy loops are created when the invention is attached and energize within a circuit, with the created energy loops in parallel, but on opposite sides of a center, common conductive plate or pathway. These energy loops are propagating 180 degrees out-of-phase with respect to one another, thus, opposing energy will cancel and noise is minimized or suppressed. An energized configuration containing multi-functional energy conditioner within a larger, energized circuitry, will also provide a plurality of potential conductive pathways, internal to multi-functional energy conditioner, that can be used by portions of energy propagating from an energy source(s) to a load or loads.

The common shielding conductive plates and/or portions of the shield-like structure made of the plate elements, when used by propagating energy from a source or from a load as a return path to energy source, will have a short distance of separation or loop area between portions of paired differential conductive paths and a return path, when the common conductive structure or common conductive plates, are used by portions of propagating energy as one, or more energy return pathways, back to its' (the portions of propagating energy's) source.

When attached to respective, external conductors or pathways, a portion of the loop area is located internal to the multi-functional energy conditioner, with the interposing, dielectric material providing a distance between a differential conductive plate or pathway and a common conductive plate or pathway. Portions of the circuits' propagating energy can move along, internal to the multi-functional energy conditioner, with portions of the circuits' propagating energy moving from a source to a load moving oppositely to that of portions of the circuits' propagating energy moving from a load back to a source within a circuit mounted, multi-functional energy conditioner.

Oppositely propagating energy, as just described, will be separated by the central common conductive shield pathway, yet, contained in the Faraday cage-like shield structure, with interposing dielectric medium, all internally within the multi-functional energy conditioner. This oppositely propagating energy will be simultaneously conditioned, with respect to the Faraday cage-like shield structure's electrostatic properties and by mutually canceling magnetic fields principals within the short distance of separation, as just described.

Grouped, common conductive electrodes or paths, physically shield most of the area of the paired differential energy conductive plates or pathways from one another, and allow close distance proximity of these differential conductive pathways to function, when energized, oppositely, and in close proximity, always separated by a common shield pathway, to still co-act in a complementary or harmonious manner and to provide effective, energy conditioning internally within the multi-functional energy conditioner.

Portions of the circuit energy in a conditioner of the present invention will, at some point in time, propagate between portions of two distinct common conductive plate areas along or on a differential conductor that is separated from the respective common conductive plate areas by a dielectric medium, as portions of said energy propagates internally within the multi-functional energy conditioner is in operation with an energized circuit.

Turning now to FIG. 1, an exploded perspective view of multi-functional energy conditioner 10's physical architecture is shown. Multi-functional energy conditioner 10 is comprised of a plurality of common conductive plates 14 at least two electrode plates 16A and 16B where each electrode plate 16 is sandwiched between two common conductive plates 14. At least one pair of electrical conductors 12a and 12b is disposed through insulating apertures 18 or coupling apertures 20 of the plurality of common conductive plates 14 and electrode plates 16A and 16B with electrical conductors 12a and 12b also being selectively connected to coupling apertures 20 of electrode plates 16A and 16B. Common conductive plates 14 consist entirely of a conductive material such as metal in the preferred embodiment or in a different embodiment, can have conductive material deposited onto a dielectric laminate (not shown) similar to processes used to manufacture chip capacitors and the like. At least one pair of insulating apertures 18 are disposed through each common ground conductive plate 14 to allow electrical conductors 12 to pass through while maintaining electrical isolation between common conductive plates 14 and electrical conductors 12. The plurality of common conductive plates 14 may optionally be equipped with fastening apertures 22 arranged in a predetermined and matching position to enable each of the plurality of common conductive plates 14 to be coupled securely to one another through standard fastening means such as screws and bolts or in alternative embodiments (not shown) that can be manufactured and joined into a standard monolithic-like fashion similar to the processes used to manufacture chip capacitors and the like. Fastening apertures 22 may also be used to secure multi-functional energy conditioner 10 to another non-conductive or conductive surface such as an enclosure or chassis of the electronic device multi-functional energy conditioner 10 is being used in conjunction with.

Electrode plates 16A and 16B are similar to common conductive plates 14 in that they are comprised of a conductive material or in a different embodiment, can have conductive material deposited onto a dielectric laminate (not shown) similar to the processes used to manufacture chip capacitors and the like and have electrical conductors 12a and 12b disposed through apertures. Unlike common conductive plates 14, electrode plates 16A and 16B are selectively electrically connected to one of the two electrical conductors 12. While electrode plates 16, as shown in FIG. 1, are depicted as smaller than common conductive plates 14 this is not required but in this configuration has been done to prevent electrode plates 16 from interfering with the physical coupling means of fastening apertures 22 and should be ideally inset, within the common conductive plates 14.

Electrical conductors 12 provide a current path that flows in the direction indicated by the arrows positioned at either end of the electrical conductors 12a and 12b as shown in FIG. 1. Electrical conductor 12a represents an electrical signal conveyance path and electrical conductor 12b represents the signal return path. While only one pair of electrical conductors 12a and 12b is shown, Applicant contemplates multi-functional energy conditioner 10 being configured to provide filtering for a plurality of pairs of electrical conductors creating a high-density multi-conductor multi-functional energy conditioner.

The final element which makes up multi-functional energy conditioner 10 is material 28 which has one or a number of electrical properties and surrounds the center common ground conductive plate 14, both electrode plates 16A and 16B and the portions of electrical conductors 12a and 12b passing between the two outer common conductive plates 14 in a manner which isolates the plates and conductors from one another except for the connection created by the conductors 12a and 12b and coupling aperture 20. The electrical characteristics of multi-functional energy conditioner 10 are determined by the selection of material 28. If a dielectric material is chosen multi-functional, energy conditioner 10 will have primarily capacitive characteristics. Material 28 may also be a metal oxide varistor material that will provide capacitive and surge protection characteristics. Other materials such as ferrites and sintered polycrystalline may be used wherein ferrite materials provide an inherent inductance along with surge protection characteristics in addition to the improved common mode noise cancellation that results from the mutual coupling cancellation effect. The sintered polycrystalline material provides conductive, dielectric, and magnetic properties. Sintered polycrystalline is described in detail in U.S. Pat. No. 5,500,629, which is herein incorporated by reference.

An additional material that may be used is a composite of high permittivity Ferro-electric material and a high permeability ferromagnetic material as disclosed in U.S. Pat. No. 5,512,196, which is incorporated by reference herein. Such a ferroelectric-ferromagnetic composite material can be formed as a compact unitary element which singularly exhibits both inductive and capacitive properties so as to act as an LC-type electrical filter. The compactness, formability, and filtering capability of such an element is useful for suppressing electromagnetic interference. In one embodiment, the ferroelectric material is barium titanate and the ferromagnetic material is a ferrite material such as one based upon a copper zinc ferrite. The capacitive and inductive characteristics of the ferroelectric-ferromagnetic composites exhibit attenuation capabilities which show no signs of leveling off at frequencies as high as 1 GhZ. The geometry of the ferroelectric-ferromagnetic composite will significantly affect the ultimate capacitive and inductive nature of an electrical filter that employs such a composite. The composite can be adjusted during its manufacturing process to enable the particular properties of a multi-functional energy conditioner to be tuned to produce suitable attenuation for specific applications and environments.

Still referring to FIG. 1, the physical relationship of common conductive plates 14, electrode plates 16A and 16B, electrical conductors 12a and 12b and material 28 will now be described in more detail. The starting point is center common ground conductive plate 14. Center plate 14 has the pair of electrical conductors 12a and 12b disposed through their respective insulating apertures 18 which maintain electrical isolation between common ground conductive plate 14 and both electrical conductors 12a and 12b. On either side, both above and below, of center common ground conductive plate 14 are electrode plates 16A and 16B each having the pair of electrical conductors 12a and 12b disposed there through. Unlike center common ground conductive plate 14, only one electrical conductor, 12a or 12b, is isolated from each electrode plate, 16A or 16B, by an insulating aperture 18. One of the pair of electrical conductors, 12a or 12b, is electrically coupled to the associated electrode plate 16A or 16B respectively through coupling aperture 20. Coupling aperture 20 interfaces with one of the pair of electrical conductors 12 through a standard connection such as a solder weld, a resistive fit or any other method which will provide a solid and secure electrical connection. For multi-functional energy conditioner 10 to function properly, upper electrode plate 16A must be electrically coupled to the opposite electrical conductor 12a than that to which lower electrode plate 16B is electrically coupled, that being electrical conductor 12b. Multi-functional energy conditioner 10 optionally comprises a plurality of outer common conductive plates 14. These outer common conductive plates 14 provide a significantly larger conductive ground plane and/or image plane when the plurality of common conductive plates 14 are electrically connected to an outer edge conductive band, conductive termination material or attached directly by tension seating means or commonly used solder-like materials to an larger external conductive surface (not shown) that are physically separate of the differentially conductive plates 16a and 16b and/or any plurality of electrical conductors such as 12a and 12b for example. Connection of common conductive plates 14 to an external conductive area helps with attenuation of radiated electromagnetic emissions and provides a greater surface area in which to dissipate over voltages and surges.

Connection of common conductive plates 14 to an external conductive area helps electrostatic suppression of any inductive or parasitic strays that can radiate or be absorbed by differentially conductive plates 16a and 16b and/or any plurality of differential electrical conductors such as 12a and 12b for example.

Principals of a Faraday cage-like structure are used when the common plates are joined to one another as described above and the grouping of common conductive plates together co-act with the larger external conductive area or surface to suppress radiated electromagnetic emissions and provide a greater conductive surface area in which to dissipate over voltages and surges and initiate Faraday cage-like electrostatic suppression of parasitics and other transients, simultaneously. This is particularly true when plurality of common conductive plates 14 are electrically coupled to earth ground (not shown) but are relied upon to provide an inherent ground for a circuit in which the invention is placed into an energized with. As mentioned earlier, inserted and maintained between common conductive plates 14 and both electrode plates 16A and 16B is material 28 which can be one or more of a plurality of materials having different electrical characteristics.

Figure 1A:
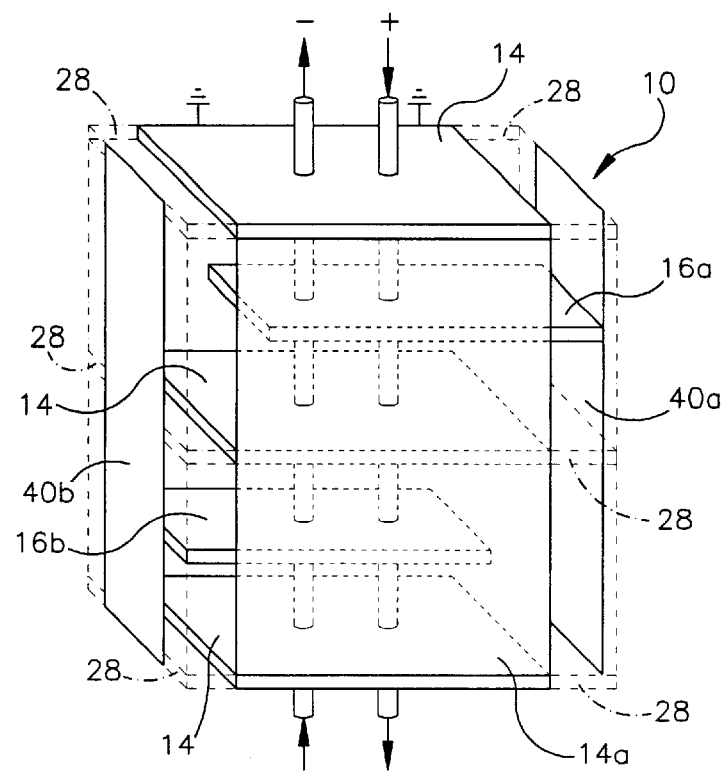
FIG. 1A shows an exploded perspective view of an alternate embodiment of the multi-functional energy conditioner shown in FIG. 1.

FIG. 1A shows an alternative embodiment of multi-functional energy conditioner 10 which includes additional means of coupling electrical conductors or circuit board connections to multi-functional energy conditioner 10. Essentially, the plurality of common conductive plates 14 are electrically connected together by the sharing of a separately located outer edge conductive band or bands 14a and/or 14b (not shown) at each conductive electrode exit and which in turn, are then joined and/or connected to the same external conductive surface (not shown) that can possess a voltage potential when the invention is placed into a portion of a larger circuit (not shown) and energized. This voltage potential co-acts with the external conductive surface area or areas through bands 14a and/or 14b (not shown) and the internal common conductive electrodes 14 of the embodiment as well as any of the conductive elements that are needed to utilize a connection that allows energy to propagate. In addition, each differential electrode plate 16A and 16B has its own outer edge conductive bands or surface, 40a and 40b respectively. To provide electrical connections between electrode plate 16A and 16B and their respective conductive band 40a and 40b while at the same time maintaining electrical isolation between other portions of multi-functional energy conditioner 10, each electrode plate 16 is elongated and positioned such that the elongated portion of electrode plate 16A is directed opposite of the direction electrode plate 16B is directed. The elongated portions of electrode plates 16 also extend beyond the distance in which the plurality of common conductive plates 14 extend with the additional distance isolated from outer edge conductive bands 40a and 40b by additional material 28. Electrical connection between each of the bands 14a and/or 14b (not shown) and their associated plates 14 is accomplished through physical contact between each 14a and 14b (not shown) band and its associated common conductive or conductive electrode plate 14, respectively.

Figure 2:
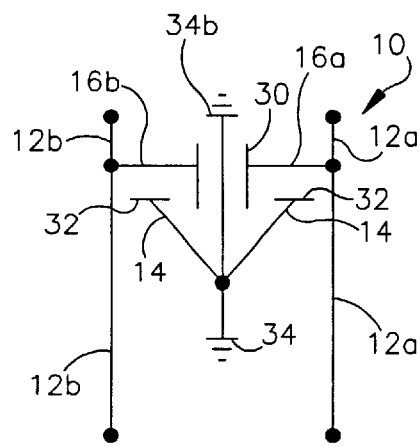
FIG. 2 provides a circuit schematic representation of the physical architecture when placed into a larger electrical system and energized.

FIG. 2 shows a quasi-schematic circuit representation of an energized portion of a circuit when the physical embodiment of multi-functional energy conditioner 10 is mated into a larger circuit and energized. Line-to-line capacitor 30 is comprised of electrode plates 16A and 16B, where electrode plate 16A is coupled to one of the pair of electrical conductors 12a with the other electrode plate 16B being coupled to the opposite electrical conductor 12b, thereby providing the two parallel plates necessary to form a capacitor. Center common ground conductive plate 14 is an essential element among all embodiments or connotations of the invention and when joined with the sandwiching outer two common conductive plates 14 together, act as inherent ground 34 and 34b which depicts band 14A and 14B (not shown) as connecting to a larger external conductive area 34 (not shown) and line-to-line capacitor 30 and also serves as one of the two parallel plates for each line-to-ground capacitor 32.

The second parallel plate required for each line-to-ground capacitor 32 is supplied by the corresponding electrode plate 16B. By carefully referencing FIG. 1 and FIG. 2, the capacitive plate relationships will become apparent. By isolating center common ground conductive plate 14 from each electrode plate 16A or 16B with material 28 having electrical properties, the result is a capacitive network having a common mode bypass capacitor 30 extending between electrical conductors 12a and 12b and line-to-ground decoupling capacitors 32 coupled from each electrical conductor 12a and 12b to larger external conductive area 34.

The larger external conductive area 34 will be described in more detail later but for the time being it may be more intuitive to assume that it is equivalent to earth or circuit ground. The larger external conductive area 34, can be coupled with the center and the additional common conductive plates 14 to join with the central plate 14 to form, one or more of common conductive plates 14 that are conductively joined and can be coupled to circuit or earth ground by common means of the art such as a soldering or mounting screws inserted through fastening apertures 22 which are then coupled to an enclosure or grounded chassis (not shown) of an electrical device. While multi-functional energy conditioner 10 works equally well with inherent ground 34B coupled to earth or circuit ground 34, one advantage of multi-functional energy conditioner 10's physical architecture is that depending upon energy condition that is needed, a physical grounding connection can be unnecessary in some specific applications.

Referring again to FIG. 1 an additional feature of multi-functional energy conditioner 10 is demonstrated by clockwise and counterclockwise flux fields, 24 and 26 respectively. The direction of the individual flux fields 24 and 26, is determined and may be mapped by applying Ampere's Law and using the right hand rule. In doing so, an individual places their thumb parallel to and pointed in the direction of current flow through electrical conductors 12a or 12b as indicated by the arrows at either ends of the conductors.

Once the thumb is pointed in the same direction as the current flow, the direction in which the remaining fingers on the person's hand curve indicates the direction of rotation for the flux fields 24 and 26. Because electrical conductors 12a and 12b are positioned next to one another and they can also represent a more than one current loop as found in many I/O and data line configurations, the currents entering and leaving multi-functional energy conditioner 10 oppose one another, thereby creating a closely positioned opposed flux fields 24, and 26 which cancel each other and minimize inductance attributed to the device. Low inductance is advantageous in modern I/O and high-speed data lines as the increased switching speeds and fast pulse rise times of modern equipment create unacceptable voltage spikes which can only be managed by low inductance surge devices and networks.

It should also be evident that labor intensive aspects of using multi-functional energy conditioner 10 as compared to combining discrete components found in the prior art provides an easy and cost effective method of manufacturing. Because connections only need to be made to either ends of electrical conductors 12 to provide a line to line capacitance to the circuit that is approx. ½ the value of the capacitance measured for each of the line to ground capacitance also developed internally within the embodiment and this provides flexibility for the user as well as providing a potential savings in time and space in manufacturing a larger electrical system utilizing the invention.

Figure 3A:
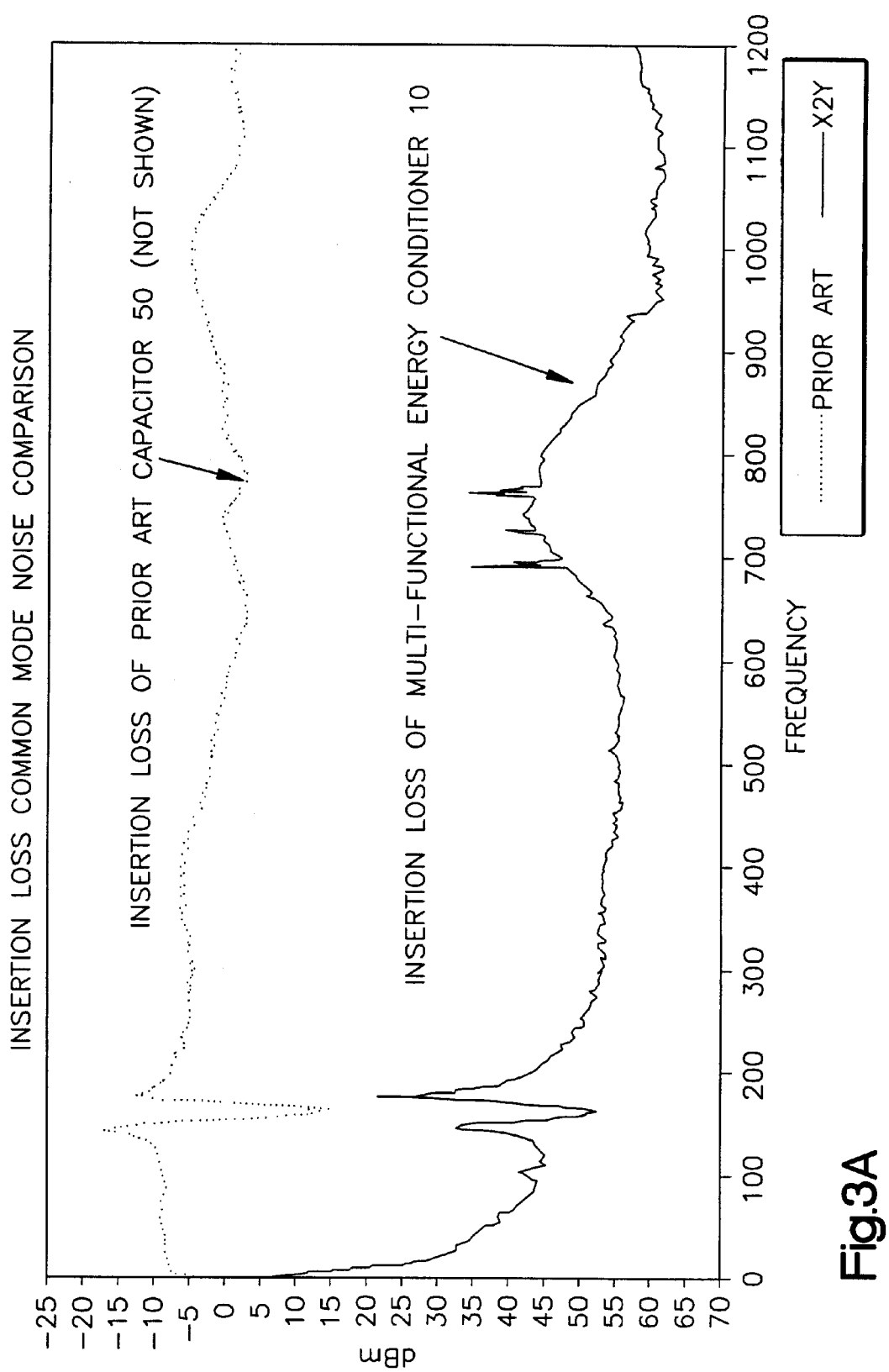
FIG. 3A is a common mode noise insertion loss comparison graph comparing the multi-functional energy conditioner of FIG. 1 with a filter comprised of a prior art capacitor showing insertion loss as a function of signal frequency.

FIG. 3A shows a comparison of a common mode insertion loss measurements taken for a multi-functional energy conditioner 10 shown in FIG. 1 measuring line to line capacitance of 0.20 uF against the response of through-hole capacitor of the prior art 50 (not shown) of the same approximately the same physical size diameter. The graph shows that prior art capacitor 50 configured line-to-line with a capacitance value of 0.47 uF performs differently as compared with the performance of multi-functional energy conditioner 10 has a capacitance value of 0.20 uF, line to line. When both multi-functional energy conditioner 10 and 50 are attached to external conductive area 34, multi-functional energy conditioner 10 demonstrates a significant and wide difference in insertion loss readings shown for frequencies up to 1200 MHZ, (which was the limit of the testing equipment) than does capacitor 50.

Figure 3B:
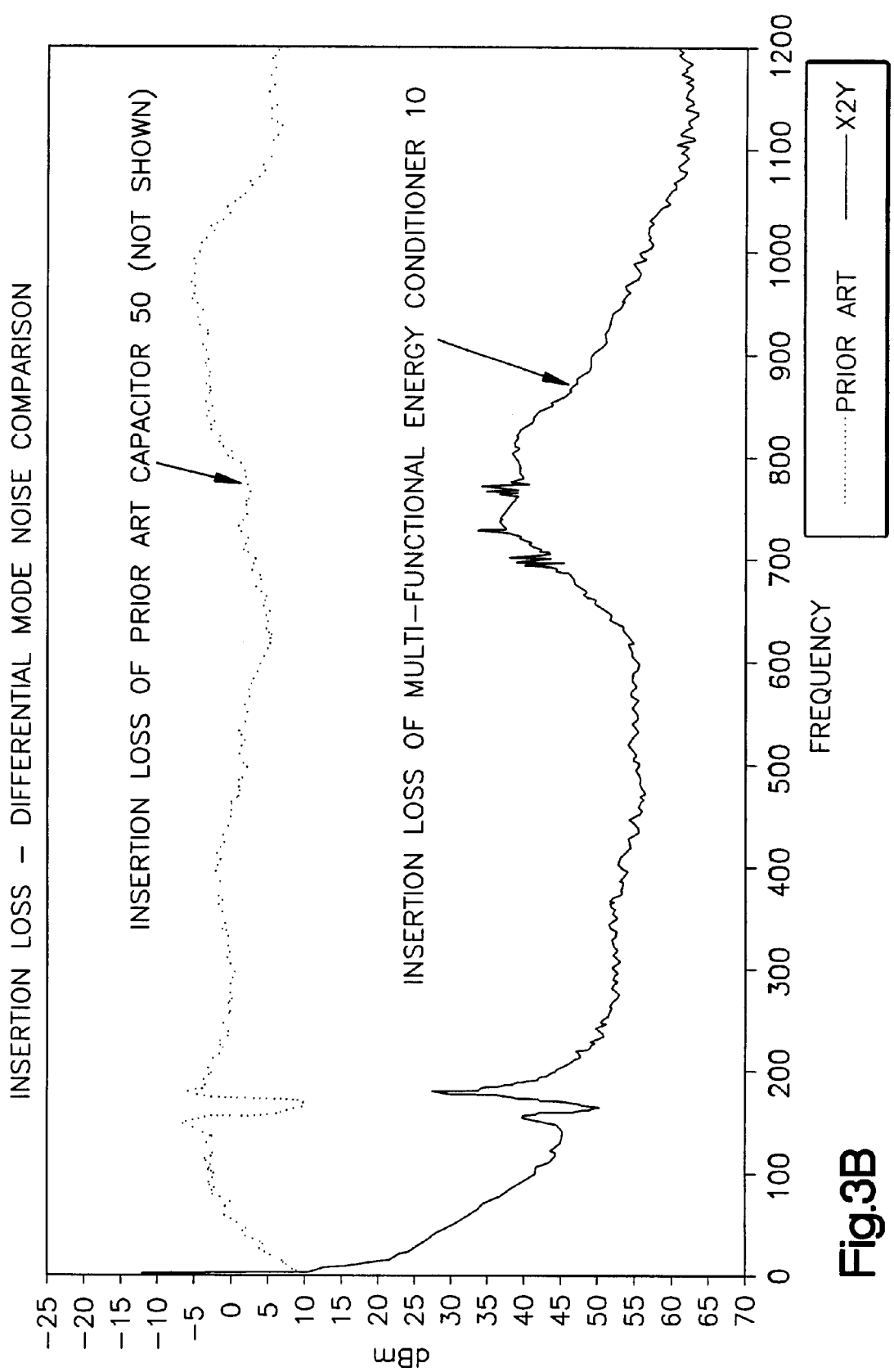
FIG. 3B is a differential mode noise insertion loss comparison graph comparing the multi-functional energy conditioner of FIG. 1 with a filter comprised of a prior art capacitor showing insertion loss as a function of signal frequency.

FIG. 3B shows a comparison of a differential mode measurements the same multi-functional energy conditioner 10 used in FIG. 3A and is relative to the response of the same through-hole capacitor of the prior art 50 (not shown) as measured in FIG. 3A. When multi-functional energy conditioner 10 and prior art capacitor 50 are both attached to external conductive area 34, multi-functional energy conditioner 10 demonstrates a significant and wide difference in insertion losses shown for frequencies up to 1200 MHZ, (which was the limit of the testing equipment).

Graph in FIG. 3B shows that a reading of prior art capacitor 50 configured line-to-ground with capacitance value of 0.47 uF is different from multi-functional energy conditioner 10 which has a line to ground capacitance value of 0.40 uF for one capacitor side of conditioner 10 and is approx. twice the value of the line to line capacitance value of 0.20 uF measured from multi-functional energy conditioner 10 before test in FIG. 3A.

Figure 4:
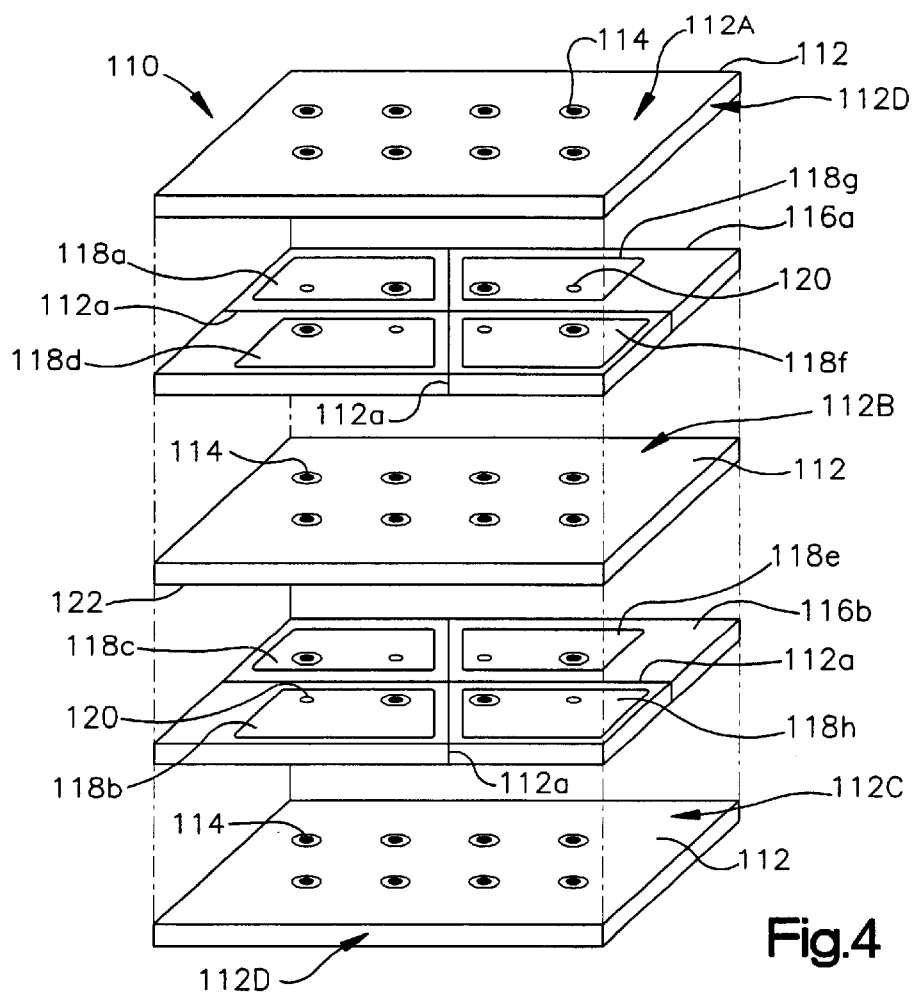
FIG. 4 is an exploded perspective view of a multi-conductor multi-functional energy conditioner for use in connector applications.

An alternate embodiment of the present invention is differential and common mode multi-conductor filter 110 shown in FIG. 4. Filter 110 is similar to multi-functional energy conditioner of FIGS. 1 and 1A in that it is comprised of a plurality of common conductive plates 112 and a plurality of conductive electrodes 118a thru 118h to form differential mode coupling capacitors and common mode decoupling capacitor arrangements which act on a plurality of pairs of electrical conductors, not shown in FIG. 4 but similar to electrical conductors 12a and 12b shown in FIGS. 1 and 1A. As described earlier for the single pair conductor multi-functional energy conditioner shown in FIG. 1, common conductive plates 112, conductive electrodes 118 and the plurality of electrical conductors are isolated from one another by a pre-selected material 122 having predetermined electrical characteristics such as dielectric material, ferrite material, MOV-type material and sintered polycrystalline material. Each of the plurality of common conductive plates 112 has a plurality of insulating apertures 114 in which electrical conductors pass while maintaining electrical isolation from the respective common conductive plates 112. To accommodate a plurality of electrical conductor pairs, multi-functional energy conditioner 110 must employ a modified version of the electrode plates described in FIGS. 1 and 1A.

To provide multiple independent conductive electrodes for each pair of electrical conductors, a support material 116 comprised of one of the materials 122 containing desired electrical properties is used. Support plate 116B is comprised of a plurality of conductive electrodes 118b, 118c, 118e and 118h printed upon one side of plate 116B with one coupling aperture 120 per electrode. Support plate 116A is also comprised of a plurality of conductive electrodes 118a, 118d, 118f and 118g printed upon one side of plate 116A. Support plates 116A and 116B are separated and surrounded by a plurality of common conductive plates 112 which together excluding conductive materials are generally made up of material 122 so to allow respective plates to be melded or laminated and/or fused together during the manufacturing process by standard means known in the art. Conductive electrode materials and insulating structures as just described are also added or deposited by standard means known in the art as well in the manufacturing process.

A conductive termination material 112D is also applied to the sides of plates 112 during manufacturing so that termination material 112D allows a conductive connection of at least the perimeter of invention 110s' plurality of common conductive plate electrodes 112A, 112B, 112C to be joined conductively together to form a single conductive structure capable of sharing a same conductive pathway to an external conductive area 34 or surface (not shown) when placed into a circuit and energized. The pairs of incoming electrical conductors each have a corresponding electrode pair within multi-functional energy conditioner 110. Although not shown, the electrical conductors pass through the common conductive plates 112 and the respective conductive electrodes. Connections are either made or not made through the selection of coupling apertures 120 and insulating apertures 114. The common conductive plates 112 in cooperation with conductive electrodes 118a thru 118h perform essentially the same function as electrode plates 16A and 16B of FIGS. 1 and 1A.

Figure 5A:
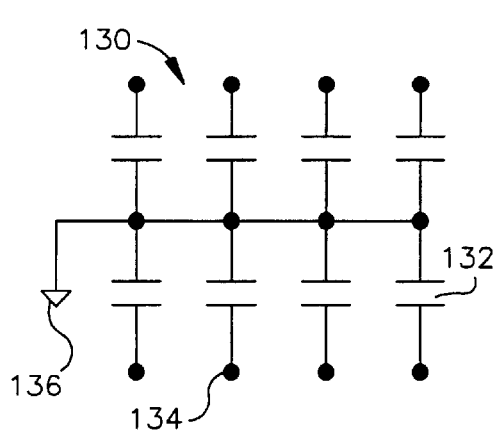
FIG. 5A shows a schematic representation of a multi-capacitor component as found in the prior art.

FIG. 5 shows schematic diagrams of prior art multi-capacitor components and differential and common mode multi-conductor multi-functional energy conditioner 110 of the present invention. FIG. 5A is a schematic of prior art capacitor array 130. Essentially, a plurality of capacitors 132 are formed and coupled to one another to provide common ground 136 for array 130 with open terminals 134 provided for connecting electrical conductors to each capacitor 132.

These prior art capacitor arrays only allowed common mode decoupling of individual electrical conductors when open terminal 134 of each capacitor 132 was electrically connected to individual electrical conductors.

Figure 5B:
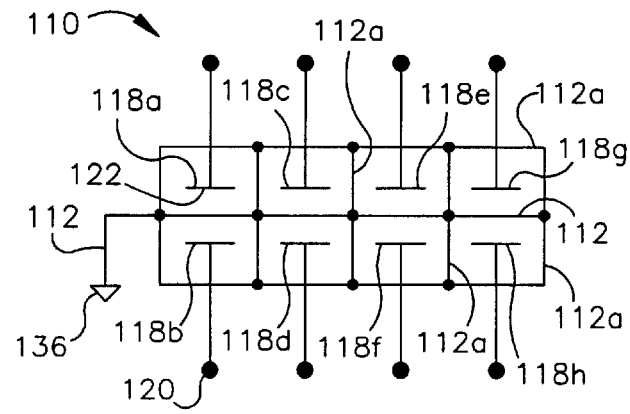
FIG. 5B shows a schematic representation of the physical embodiment of the multi-functional energy conditioner of FIG. 4.

FIG. 5B shows a schematic representation of differential and common mode multi-conductor multi-functional energy conditioner 110 having four differential and common mode filter pin pair arrangements. The horizontal line extending through each pair of electrodes represents the common conductive plate electrodes 112A, 112B and 112C with the lines encircling the pairs being the conductive isolation material 112a. The conductive isolation material 112a is electrically coupled to common conductive plate electrodes 112A, 112B and 112C and side conductive termination material 112D to provide a conductive grid that is further separated from electrode plates 118a through 118h by areas left free of conductive material that allows a separation of each of the conductive electrode plates 118a through 118h from one another and the conductive grid, as well. The corresponding conductive electrodes 118a thru 118h positioned on support material plates 116A and 116B, both above and below the center common ground conductive plate 112, and form line-to-ground common mode decoupling capacitors. Each conductive plate electrodes 118a thru 118h common conductive plate electrodes 112A, 112B and 112C and support material plates 116A and 116B, are separated from the others by dielectric material 122. When multi-functional energy conditioner 110 is connected to paired, electrical conductors via coupling apertures 120 such as those found in electrode plates 118a and 118c, multi-functional energy conditioner 110 forms a common mode and differential mode filter.

Again referring to FIG. 4, multi-conductor multi-functional energy conditioner 110 is shown having not only a center common conductive plate electrode 112B but also outer common conductive plates 112A and 112C. As described in relation to FIGS. 1 and 1A these outer common conductive plates and common conductive electrodes 112A, and 112C when joined together to each other and with each respective inventions central common conductive plate 14 or central common conductive electrode 112B and an external conductive area 34, (not shown) provide a significantly larger conductive pathway or area for multi-functional energy conditioner 110 to simultaneously suppress and/or minimize and/or attenuate radiated and conductive electromagnetic emissions of the paired conductors and provide shielding between said conductive plates and electrodes of FIG. 1 and FIG. 1A or other invention embodiments, and provide a greater surface area to dissipate and/or absorb over voltages, surges and other transient noise, and effectively acts as a Faraday cage-like shield when energized.

One trend found throughout modern electronic devices is the continuous miniaturization of equipment and the electronic components that make up that equipment. Capacitors, the key component in multi-functional energy conditioner arrangements, have been no exception and their size has continually decreased to the point where they may be formed in silicon and imbedded within integrated circuits only seen with the use of a microscope. One miniaturized capacitor which has become quite prevalent is the chip capacitor which is significantly smaller than standard through hole or leaded capacitors. Chip capacitors employ surface mount technology to physically and electrically connect to electrical conductors and traces found on circuit boards. The versatility of the architecture of the multi-functional energy conditioner of the present invention extends to surface mount technology as shown in FIG. 6.

Figure 6A:
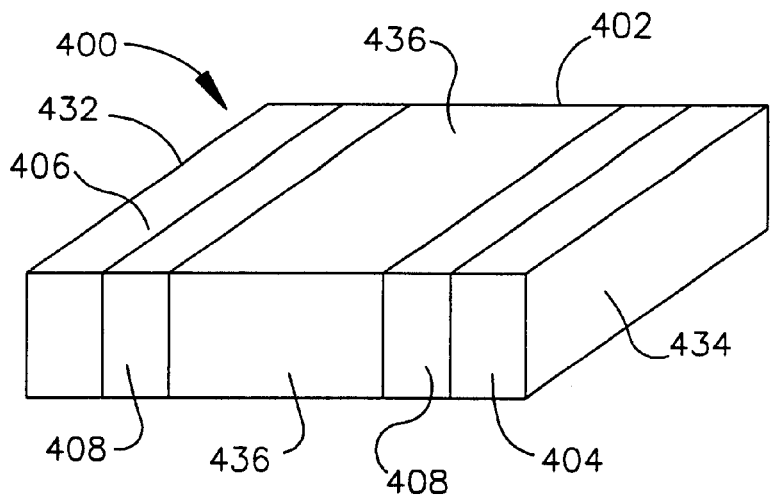
FIG. 6 shows a surface mount chip embodiment of a multi-functional energy conditioner with FIG. 6A being a perspective view and FIG. 6B showing an exploded perspective view of the same.
Figure 6B:
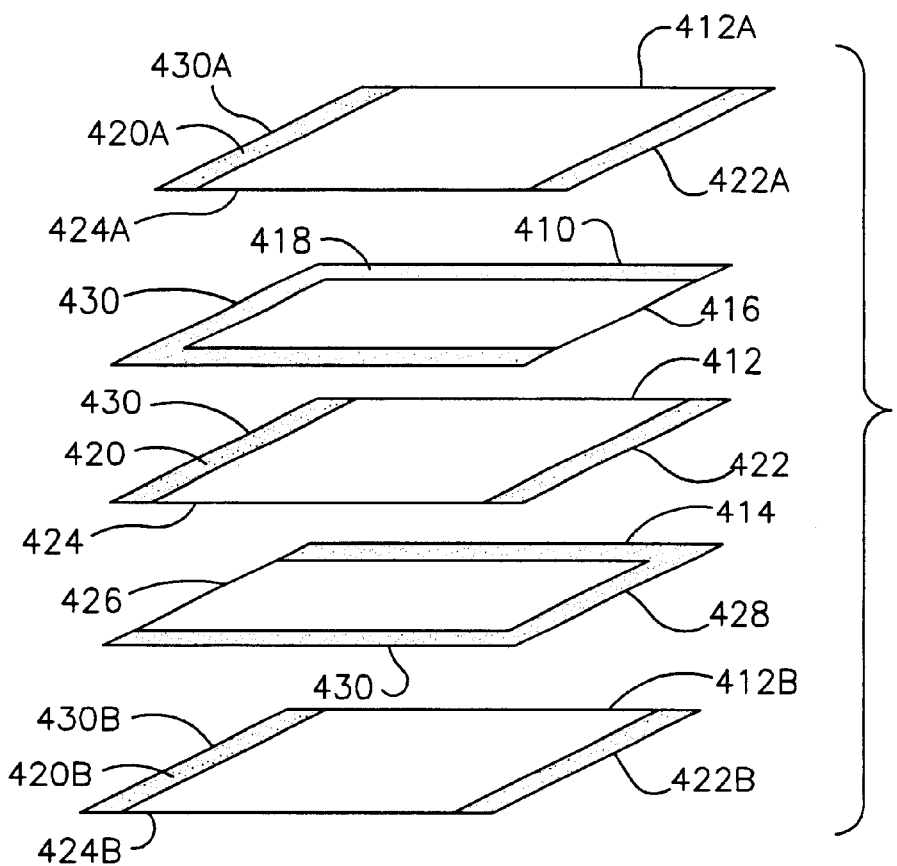

Surface mount multi-functional energy conditioner 400 is shown in FIG. 6A with its internal construction shown in FIG. 6B. Referring to FIG. 6B, common conductive support plate 412 is sandwiched between first differential support plate 410 and second support differential plate 414. Common conductive support plate 412 and first and second differential support plates 410 and 414 are each comprised of material 430 having desired electrical properties dependent upon the material chosen. As for all embodiments of the present invention, Applicant contemplates the use of a variety of materials such as but not limited to dielectric material, MOV-type material, ferrite material, film such as Mylar and newer exotic substances such as sintered polycrystalline.

First differential support plate 410 includes conductive electrode 416 coupled to the top surface of material 430 in a manner which leaves isolation band 418 surrounding the outer perimeter of first differential plate 416 along three of its four sides. Isolation band 418 is simply a portion of material 430 that has not been covered by conductive electrode 416. Second differential plate 426 is essentially identical to first differential plate 416 with the exception being its physical orientation with respect to that of first differential plate 416. Second differential support plate 414 is comprised of material 430 having conductive electrode 426 coupled to the top surface of material 430 in such a manner as to leave isolation band 428 surrounding the outer perimeter of second differential plate 426 along three of its four sides. What is important to note about first and second differential plates 416 and 426's physical orientation with respect to one another is that the one side of each plate in which isolation bands 418 and 428 do not circumscribe are arranged 180 degrees apart from one another. It is also important to note about first and second differential plates 416 and 426's physical orientation with respect to the common conductive plate 424 is that all though not shown, but further explained in FIG. 19.

The conductive area of each differential electrodes 416 and 426 respectively, are physically shielded from the other by the interpositioned central common conductive electrode 424 such that the boundary or perimeter of each respective differential electrode 416 and 426 is inset with respect to the common conductive electrode 424 border or perimeter to a degree that the common conductive plate 424 registration area or under lap area allows the common conductive plate 424 to appear oversized in relation to the equally-sized differential conductive plates 416 and 426 that sandwich said common conductive plate 412.

With respect to the common conductive electrode 424 and the range of the over lap with respect to the equally sized differential plates 416 and 426 can be essentially inset to a degree that when energized the entrapment of parasitics attempting to escape or enter the area occupied by differential electrodes 416 and 426 is sufficient to prevent such degradation from occurring. Insetting of differential conductive plates 416 and 426 to a point with respect to a larger set of common plates 424, 424a, 424b that are sandwiching differential plates 416 and 426 and will increase the electrostatic shielding effectiveness during an energized state. This orientation allows an electrical conductor to be coupled electrically to either individual differential plate 416 and 426 but not necessarily both, so to allow for differentially phased, but complementary energy conditioning, between paired, but oppositely positioned, differential conductors, 416 and 426.

Common support plate 412 is similar in construction to first and second differential support plates 410 and 414 in that it, too, includes material 430 with common conductive electrode 424 coupled to its top surface. As can be seen from FIG. 6B, common plate 424 has two isolation bands 420 and 422 positioned at opposite ends. Common plate 424 is aligned in between first and second differential plates 416 and 426 so that isolation bands 420 and 422 are aligned with the ends of first and second differential plates 416 and 426 that do not have isolation bands.

All three plates, common plate 424 and first and second differential plates 416 and 426 do not have any type of conductive surface beneath each plate and therefore when the plates are stacked one on top of the other, differential conductive electrode 416 is isolated from common conductive electrode 424 by the backside of common support plate 412. In a similar fashion, common conductive electrode 424 is isolated from differential conductive electrode 426 by the backside of first differential support plate 410 that is comprised of material 430.

Referring now to FIG. 6A, the construction of surface mount multi-functional energy conditioner 400 will be further described. Once common plate 424 and first and second differential plates 416 and 426 are sandwiched together according to the arrangement shown in FIG. 6B and FIG. 19 as described, two additional common conductive plates 424A and 424B are positioned to sandwich differential plates 416 and 426 that are in turn, sandwiching common conductive plate 424. Plates 424B and 424A are essentially the same in material make-up, size, and a generally parallel orientation of their respective bands and electrode edges with that of said center conductive plate 424 within the embodiment.

A means for coupling electrical conductors to the differential electrodes 416 and 426 must be included. Electrical conductors are coupled to surface mount multi-functional energy conditioner 400 through first differential conductive band 404 and second differential conductive band 406, which are isolated from common conductive band 402 by isolation bands 408 positioned in between conductive bands 402, 404 and 406. Common conductive band 402 and isolation bands 408 can extend 360 degrees around the body of 400 multi-functional energy conditioner to provide isolation on all four sides, however because of the almost complete shield-like envelopment of differential conductive electrodes 416 and 426 by common conductive plates 424, 424A and 424B, common conductive band 402 can be reduced in size or even eliminated by replacing conductive band 402 with conductive termination structures (not shown), but similar in appearance and function of termination bands 84 found on FIG. 14 or of the type normally used in the art. First and second differential conductive bands 404 and 406 not only extend 360 degrees around respective portions of multi-functional energy conditioner 400, but also extend to cover ends 432 and 434, respectively.

By referring back and forth between FIGS. 6A and 6B, the coupling between the conductive bands and the plates can be seen. First differential conductive band 404 including end 434 maintains electrical coupling with differential conductive electrode 416 which does not have isolation band 418 extending to the end of first differential plate 416. Second differential conductive band 406 is electrically isolated from common plate 424 and first differential plate 416 due to isolation band 422 and 428 respectively.

In a similar fashion to that just described, second differential conductive band 406 including end 432 is electrically coupled to second differential conductive electrode 426 of second differential support plate 414. Due to isolation bands 420, 420A, 420B and 422, 422A and 422B of common support plates 412, 412A and 412B and first differential plate 416, the second differential conductive band 406 is electrically isolated from the first differential plate 416 and common plates 424, 424A and 424B.

Electrical coupling of common conductive band 402 to common plates 424, 424A and 424B is accomplished by the physical coupling of sides 436 of common conductive band 402 or its substitutions, to common conductive electrodes 424, 424a, 424b, which lack isolation bands along two sides. To maintain electrical isolation of common conductive electrodes 424, 424A, 424B from first and second differential conductive bands 404 and 406, isolation bands 420, 420A, 420B and 422, 422A, 422B of common plates 412, 412A, 412B prevent any physical coupling of ends 432 and 434 of first and second differential conductive bands 404 and 406 with common conductive electrodes, 424, 424A, 424B.

As with the other embodiments of the differential and common mode multi-functional energy conditioner of the present invention, conductive electrodes 416 and 426 of first and second differential support plates 410 and 414 act as a line-to-line differential mode capacitor when electrical conductors are coupled to first and second differential conductive bands 404 and 406. Line-to-ground decoupling capacitors are formed between each conductive electrode, 416 and 426 respectively, and coupled, common conductive electrodes 424, 424A, 424B, which form a Faraday cage-like shield structure 800 (not shown).

Figure 7:
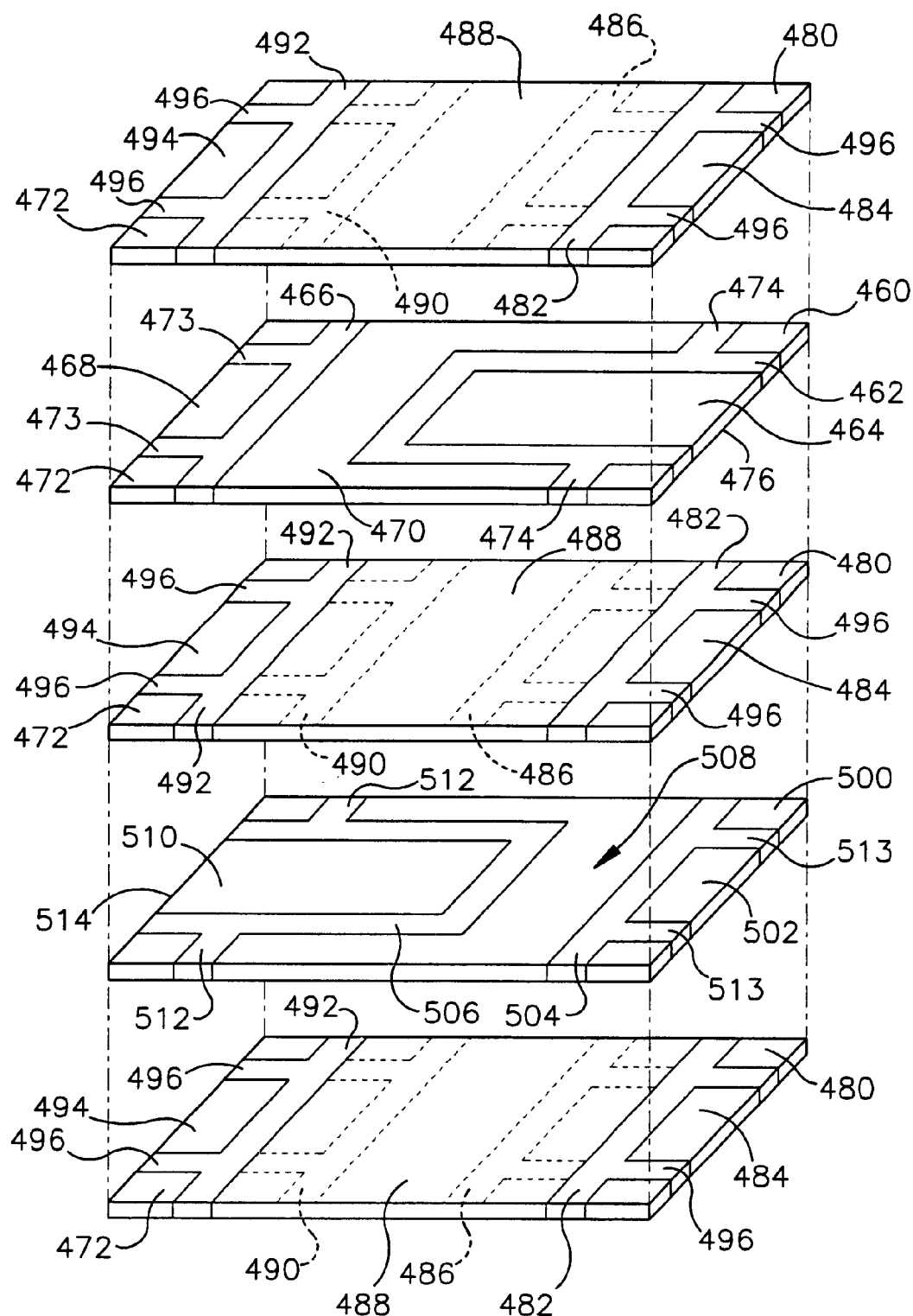
FIG. 7 is an exploded perspective view of the individual film plates that comprise a further embodiment of a multi-functional energy conditioner.

FIG. 7 discloses a further embodiment of a multi-functional energy conditioner formed on a Mylar-like or film medium. This embodiment is comprised of a film medium and metalizing or conductiveization that is applied by means known in the art and consists of a common conductive plate 480 followed by the first electrode differential plate 460, then another common conductive plate 480 and second electrode differential plate 500, then another common conductive plate 480. Each plate is essentially comprised of film 472, which itself may be comprised of a number of materials such as but not limited to Mylar, wherein film 472 is completely metallized or made conductive with another electrically friendly material on one side creating a metallized or conductively made plate. Using lasers, portions of metallized or applied conductive material are removed ("de-metallized") in predetermined patterns to create isolation barriers. First differential plate 460 has two laser edged isolation barriers 462 and 466, which divide first differential plate 460 into three conductive areas: electrode 464, isolated electrode 468 and common electrode 470. Second differential plate 500 is identical to first differential plate 460 in that it has two isolation barriers 506 and 504 which divide second differential plate 500 into three conductive areas: electrode 510, isolated electrode 502 and common electrode 508. For both first and second differential plates 460 and 500, isolation barriers 462 and 506 are essentially U-shaped to create electrodes 464 and 510 that encompass a large area of first and second plates 460 and 500. U-shaped isolation barriers 462 and 506 allow electrode 464 and 510 to extend fully to ends 476 and 514, respectively. Extending from isolation barrier 462 and 506 are members 474 and 512 and extending from isolation barriers 466 and 504 are members 473 and 513. Members 474 and 512 extend perpendicular to and outward from the ends of u-shaped isolation barriers 462 and 506 at their points nearest ends 476 and 514 and members 473 and 513 extend perpendicular to and outward from isolation barriers 466 and 504 respectively in order to fully isolate common electrodes 470 and 508 from ends 476 and 514. In addition, both first and second differential plates 460 and 480 have isolated electrodes 468 and 502 formed on opposite of ends 476 and 514 by isolation barriers 466 and 504.

Common conductive plate 480 includes isolation barriers 482 and 492 which divide common conductive plate 480 into three conductive surfaces: common electrode 488, isolated electrode 484 and isolated electrode 494. As shown, isolation barriers 482 and 492 run vertically adjacent to and in parallel with the right and left edges of common conductive plate 480. Both isolation barriers 482 and 492 also include members 496 extending outward and perpendicular from the vertical sections of isolation barriers 482 and 492 and are positioned so when plates 460, 480 and 500 are stacked, they are aligned with the horizontal portions of the U-shaped isolation barriers 462 and 506 of first and second differential plates 460 and 500.

An additional feature is that common conductive plate 480 can be optimized for use in filtering AC or DC signals. Isolation barriers 492 and 482 as described above are optimized for use in filtering DC signals. For DC operation, isolated electrodes 484 and 494 require very little area within common conductive plate 480. When the filter is comprised of a film medium and used for filtering AC signals, isolated electrodes 484 and 494 require a greater area, which is accomplished by etching modified isolation barriers 486 and 490. The vertically running isolation barriers 484 and 494 are etched closer together and closer to the center of common conductive plate 480. To accommodate this modification, members 496 extending outward and perpendicular from the vertical sections are longer than for the DC version. The greater area isolated electrodes 484 and 494 provide better AC filtering characteristics, although either configuration provides filtering to both types of current.

FIGS. 8 through 9 are directed towards embodiments of the multi-functional energy conditioner configured for use with electric motors but certainly not limited by this embodiment from performing energy conditioning in other electronics applications. Electric motors are a tremendous source of electromagnetic emissions and unbalance. This fact is evident even to layman, as most people have experienced running a vacuum cleaner in front of an operating television set and noticing "snow" fill the screen. This interference with the television is due to the electromagnetic emissions from the motor. Electric motors are used extensively in a number of home appliances such as washing machines, dryers, dishwashers, blenders, and hair dryers. In addition, most automobiles contain a number of electric motors to control the windshield wipers, electric windows, electric adjustable mirrors, retractable antennas and a whole host of other functions and can number from 25 motors per automobile to over 150 per luxury automobile. Due to the prevalence of electric motors and increased electromagnetic emissions standards, there is a need for differential and common mode filtering ability in one integrated packaged that can reduce and in many cases eliminated all but one passive component to provide the needed filtering and noise suppression without use of inductor or ferrite components used in addition to an invention embodiment.

Electric motor filter 180 may be made in any number of shapes but in the preferred embodiment shown in FIG. 8, it appears as a rectangular block comprised of material 182 having one of a number of predetermined electrical properties. FIG. 8a shows the outer construction of filter 180, which consists of a rectangular block of material 182 having an insulated shaft aperture 188, disposed through filter 180's center. The 188 aperture is not necessarily common to this particular usage and is considered more as a convenience to the user than any electrical conditioning enhancements attributed to any said 188 aperture and thus it can be eliminated and optimally placement space is designed in for use. Conductive bands 184 and 194 and common conductive bands 186. FIG. 8b shows a side view of filter 180 with the arrangement of conductive bands 184 and 194 and common conductive band 186 being electrically and physically isolated from one another by sections of material 182 positioned between the various bands. FIG. 8c shows a cross section along an imaginary centerline of FIG. 8a. As in all previous embodiments, the physical architecture of the present invention is comprised of conductive electrodes 181 and 185 with common conductive electrode 183 sandwiched in between. Material 182 having predetermined electrical properties is interspersed between all of the electrodes to prevent electrical connection between the various conductive electrodes 181 and 185 and common conductive electrode 183. Similar to that of the surface mount embodiments of the present invention, filter 180 employs conductive bands 184 and 194 to electrically connect filter 180's internal electrodes to electrical conductors. Conductive electrode 181 extends fully to and comes in contact with conductive band 184 to provide the electrical interface required. As shown in FIG. 8c, conductive electrode 181 does not extend fully to come in contact with conductive band 194 which is coupled to conductive electrode 185. Although not shown, common conductive electrode 183 extends fully between common conductive bands 186 without coming in contact with conductive bands 184 and 194. Again, by coupling common conductive bands 186 to the inside of the motor case 200 (inside, not Shown) and used as a floating ground, the inherent ground provided by common conductive electrode 183 is enhanced.

FIG. 8d is a schematic representation of differential and common mode electric motor filter 180 showing conductive electrodes 181 and 185 providing the two necessary parallel plates for a line-to-line differential mode coupling capacitor while at the same time working in conjunction with common conductive electrode 183 to provide line-to-ground common mode decoupling capacitors with common conductive electrode 183 co-acting with inherent ground (not shown). Also shown are conductive bands 184, 194 and common conductive bands 186 which allow electric motor filter 180 to be connected to external differential electrical conductors and a separate conductive area (not shown), respectively. While the preferred embodiment of FIG. 8 shows three common conductive electrodes 183 and two conductive electrodes 181 and 185, Applicant contemplates the use of a plurality of common and differential electrodes to obtain, varying capacitance values through the additive effect of parallel capacitance similar to that described for previous embodiments.

FIG. 9 shows differential and common mode electric motor filter 180 electrically and physically coupled to electric motor 200. As shown in FIG. 9a, electric motor filter 180 is placed on top of electric motor 200 having motor shaft 202 extending outward there from. Motor shaft 202 is disposed through shaft aperture 188 of filter 180 with conductive bands 184 and 194 electrically coupled to connection terminals 196 which are isolated from one another and the rotor of electric motor 200. The individual connection terminals 196, although not shown, are then electrically connected to electrical supply lines providing electric motor 200 with power and return. Once electric motor filter 180 is connected/coupled to electric motor 200, motor face plate 208 is placed on top of both motor 200 and filter 180 with motor shaft 202 disposed through a similar aperture in the center of motor face plate 208. Face plate 208 is then physically coupled to the body of motor 200 through the use of clamps 206. While not shown, filter 180 may be used with its inherent ground 34 and 34B by coupling common conductive bands 186 to the motors enclosure or common conductive bands 186 may be directly wired to inside the motor shell casing.

Figure 9C:
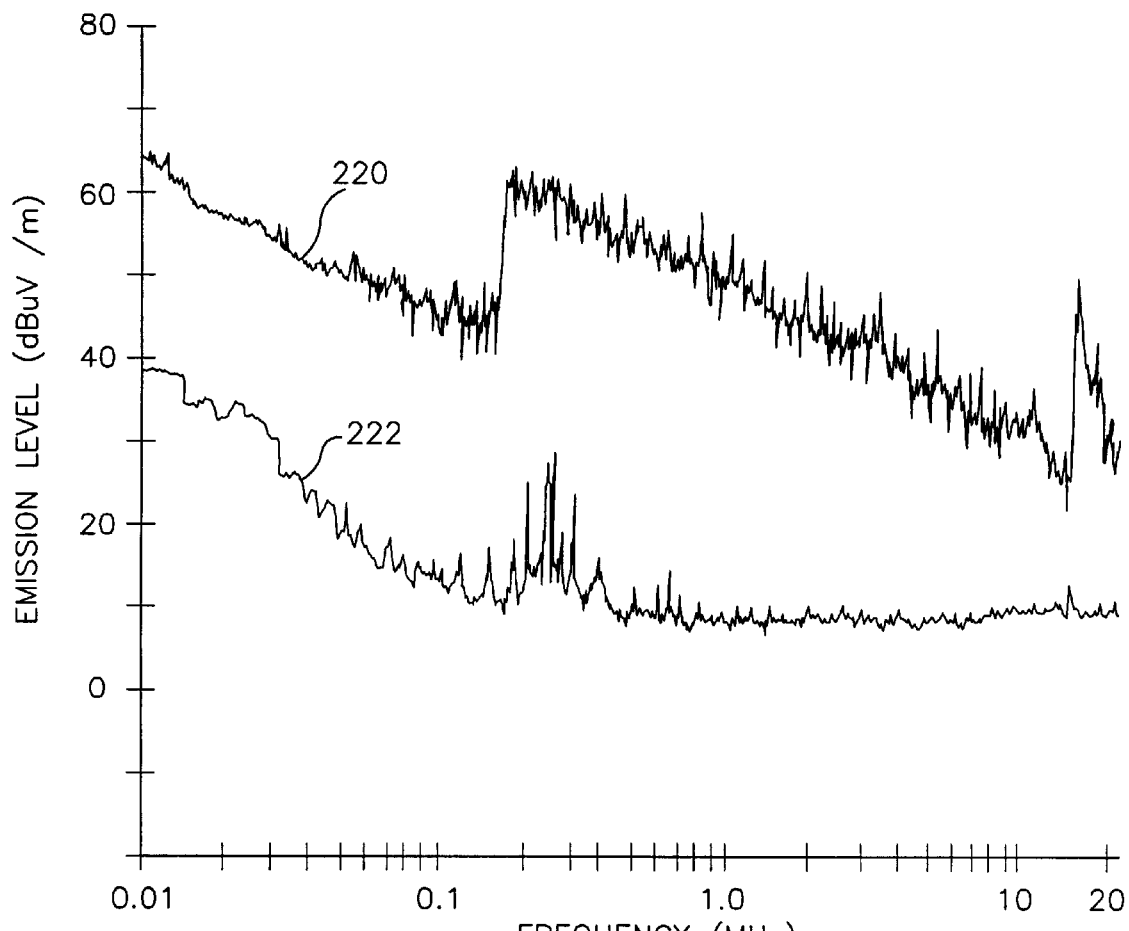
FIG. 9C is a logarithmic graph showing a comparison of the emission levels in dBuV/m as a function of frequency for an electric motor with a standard filter and an electric motor with the differential and common mode filter of FIG. 8.

FIG. 9C is a logarithmic graph showing a comparison of electric motor 200's electromagnetic emission levels as a function of frequency with the result of an electric motor having a standard filter being shown at 220 and the results of differential and common mode electric motor filter 180 shown at 222. The graph demonstrates that between 0.01 MHz and approximately 10 MHz there is a minimum of an additional 20 dB of suppression of the electromagnetic emissions using filter 180 as compared to the prior art filter throughout the range with even more pronounced decreases in the 0.1 to 1 MHz range. One can see that at the upper frequency range of 10–20 MHz and beyond, the decrease in electromagnetic emissions is not as great as at the lower frequencies but this is not particularly critical as most electric motors operate well below this frequency range thereby allowing electric motor filter 180 to provide enhanced performance with decreased electromagnetic emissions for the majority of applications.

The differential and common mode filter has been presented in many variations both above and in commonly owned patents and patent applications, previously incorporated herein by reference. A further embodiment of the present invention utilizes a variation of the filter previously discussed. Shielded twisted pair feed through differential and common mode filter 300 is shown in FIG. 10A. The difference between this filter 300 and earlier presented filters is the location of first differential electrode bands 302A, 302B and second differential electrode bands 306A, 306B, which are located diagonally from each other, respectively. Common ground conductive bands 304 are separated from first and second differential electrode bands 302 and 306 by insulating material 308 as in the previous filter embodiments. Shielded twisted pair feed through differential and common mode filter 300 comprises a minimum of a first and second differential electrode plates 312 and 316, respectively, and a minimum of three common ground conductive plates 314 as shown in FIG. 10B. The electrode plates 312, 314, and 316 are stacked and insulated from each other by material 308 as in the previous filter embodiments.

Figure 10D:
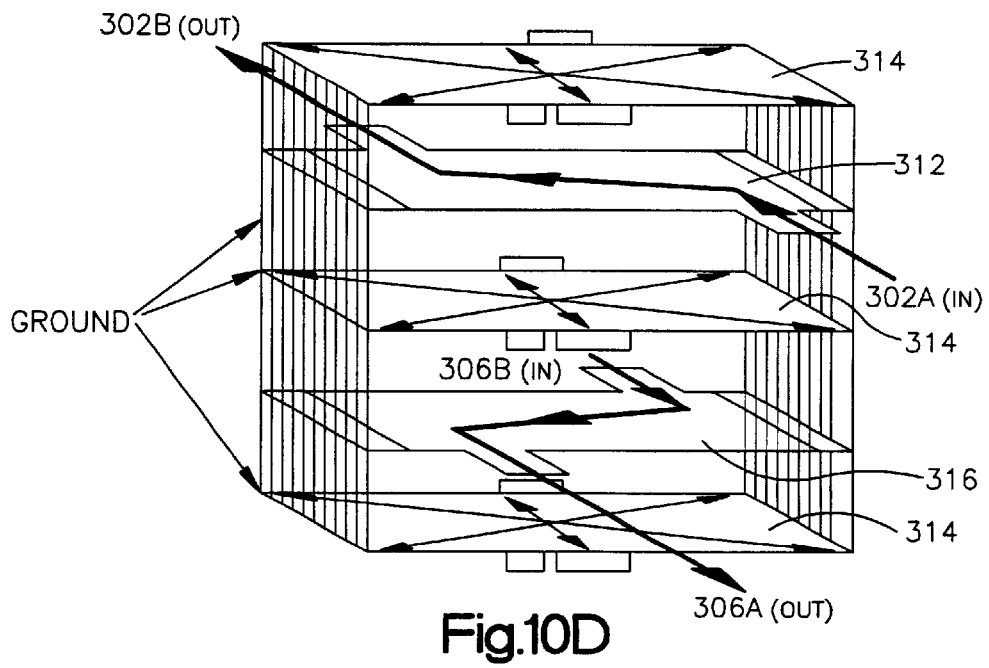

Referring now to FIGS. 10C and 10D, which show schematic representations of shielded twisted pair feed through differential and common mode filter 300 and how it is used to eliminate differential noise. Current I is shown flowing in opposing directions through first and second differential electrode bands 302A and 306B, crossing over each other, and flowing out through first and second differential electrode bands 302B and 306A. The crossover point of the current I acts as a line to line capacitor while the common conductive ground plate 314 provides line to ground capacitors on either side of the crossover point.

In FIG. 10D, the filter 300 is depicted as generally parallel electrode plates 312, 314, and 316, with electrode plates 312, 316, each sandwiched by common ground conductive plates 314 in a Faraday cage-like shield structure configuration. The current I is shown flowing in opposite directions through the differential electrode plates. Note that the common ground conductive plates 314 are electrically interconnected, but insulated from the differential electrodes as has been disclosed in filter embodiments previously incorporated by reference herein.

Figure 10E:
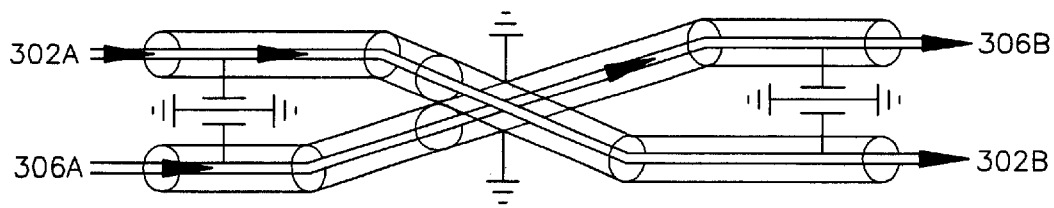
FIG. 10E and FIG. 10F are schematic representations of a shielded twisted pair feed through multi-functional energy conditioner showing common mode noise cancellation.
Figure 10F:
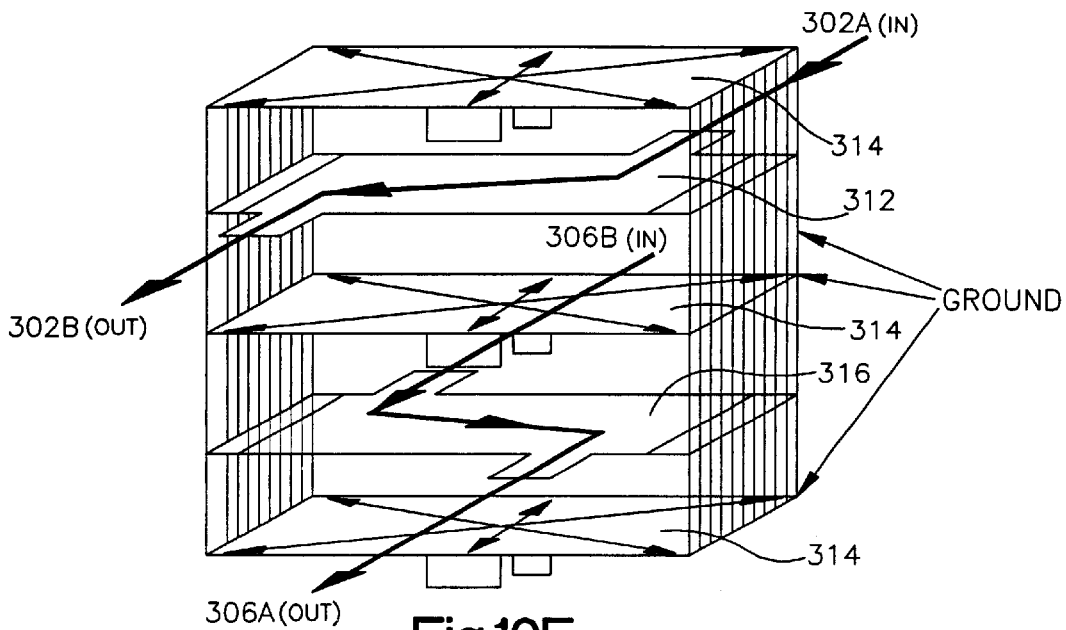

Referring now to FIGS. 10E and 10F, which show schematic representations of shielded twisted pair feed through differential and common mode filter 300 and how it is used to eliminate common mode noise. Current I is shown flowing in the same directions through first and second differential electrode bands 302A and 306A, crossing over each other, and flowing out through first and second differential electrode bands 302B and 306B. The crossover point of the current I acts as a line to line capacitor while the common conductive ground plate 314 provides line to ground capacitors on either side of the crossover point.

In FIG. 10F, the filter 300 is again depicted as generally parallel electrode plates 312, 314, and 316, with electrode plates 312, 316, each sandwiched by common ground conductive plates 314 in a Faraday cage-like shield structure configuration. The current I is shown flowing in the same direction through the differential electrode plates. Note that the common ground conductive plates 314 are electrically interconnected, but insulated from the differential electrodes as has been disclosed in filter embodiments previously incorporated by reference herein.

Figure 11A:
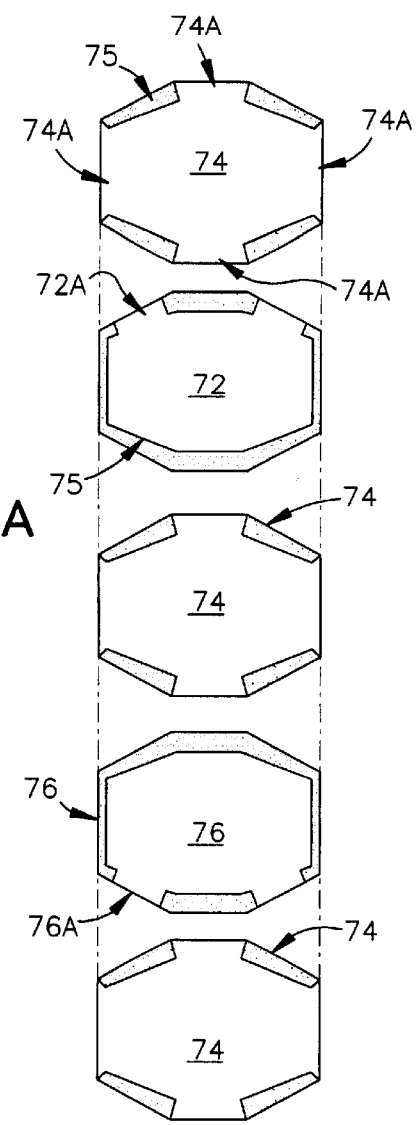
FIG. 11 shows a top plan view of the common conductive electrode shield plates and differential electrode plates which make up an alternate embodiment of the multi-functional energy conditioner placed in a bypass configuration in accordance with the present invention followed by a composite top plan view and a composite side elevation view of the multi-functional energy conditioner.
Figure 12A:
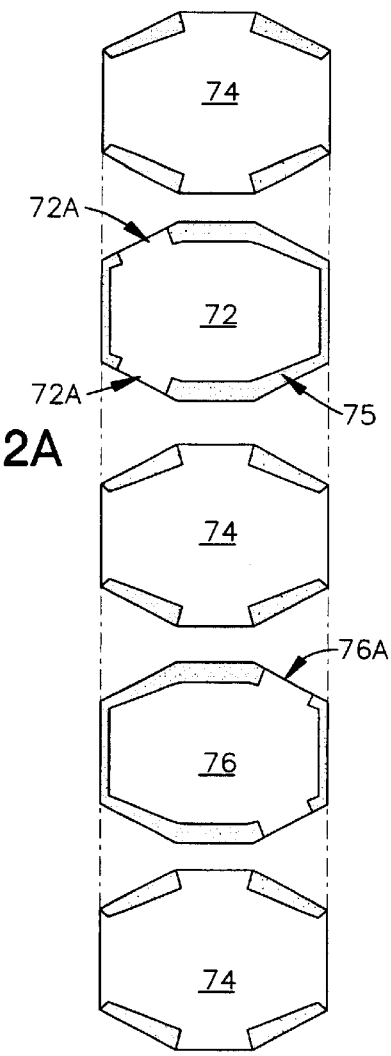
FIG. 12 shows a top plan view of the common conductive electrode shield plates and differential electrode plates which make up an alternate embodiment of the multi-functional energy conditioner placed in a feed-through configuration in accordance with the present invention followed by a composite top plan view and a composite side elevation view of the multi-functional energy conditioner.
Figure 11B:
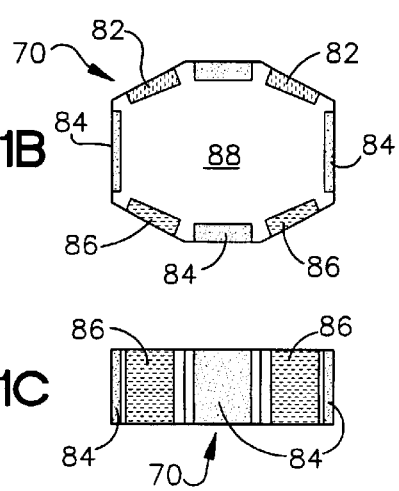
Figure 12B:
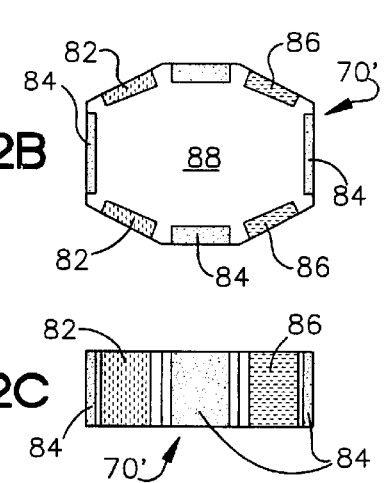
Figure 11C:
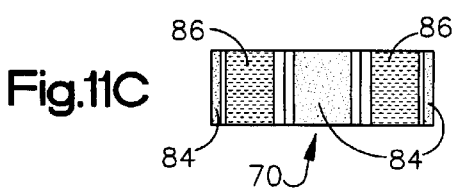
Figure 12C:
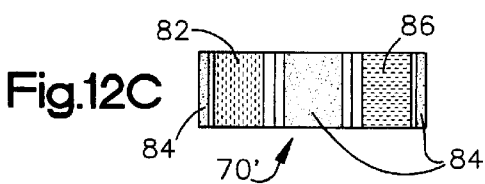

The filter of the present invention may exist in innumerable embodiments. As an example of various types of layered configurations contemplated, but not intended to limit the invention, various additional embodiments of multi-component filters will be described. In each figure, the five electrode plates are shown individually and then in a top plan view and finally in a side view. Referring now to FIGS. 11 and 12, two different embodiments of the invention 70, 70' are shown, FIG. 11 in bypass, FIG. 12 in feed-thru. As in the previous embodiment 300, the current must flow through the electrodes to complete the circuit in FIG. 12. Each of the embodiments has a first differential electrode plate 72 and a second differential electrode plate 76 sandwiched between three common conductive plates 74. The plates are generally surrounded on the perimeter of each plate 72, 74, 76 by material 75, however, terminal portions 72a, 74a, 76A, respectively, of the plates extend through the material. These terminal portions 72a, 74a, 76A are connected to first differential conductive bands 82, common conductive bands 84, and second differential conductive bands 86, respectively, to provide external connection to an energized circuit (not shown).

The conductive bands 82, 84, 86 are isolated from each other by an insulated outer casing 88. Common conductive plates 74 have four common conductive bands 84, which provide four places of attachment to external, ground areas of an electrical circuit system, wherein each common conductive band 84 is about 90 degrees from the next adjacent common conductive band 84. This feature provides additional isolation and centralizing of the line conditioning capabilities of the structures and provides improved charge concentration.

The primary difference between the filters 70, 70' is that the electrode terminal portions 72a, 76A are on the same longitudinal side in the filter 70 while the electrode terminal portions are on the opposite longitudinal side in the filter 70'. Also current dose not pass through filter 70 as it does in filter 70'. The different terminal locations provide versatility in the applicability of the filters to different electrical circuit system configurations.

Figure 13A:
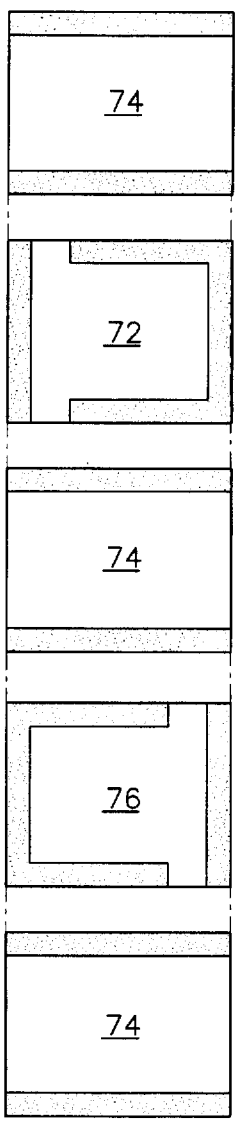
FIG. 13 shows a top plan view of the common conductive electrode shield plates and differential electrode plates which make up an alternate embodiment of the multi-functional energy conditioner placed in a feed-through configuration in accordance with the present invention followed by a composite top plan view and a composite side elevational view of the multi-functional energy conditioner.
Figure 13B:
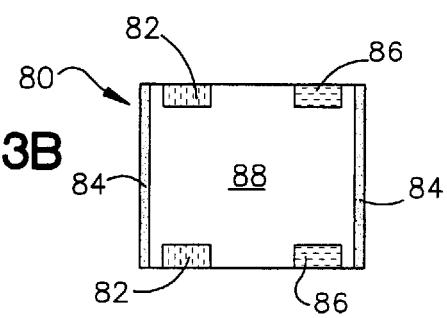
Figure 13C:
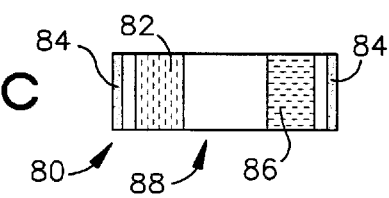

Referring now to FIG. 13, the filter shown 80 is identical to the filter 70' shown in FIG. 12 except that the shape is rectangular and there are only two common conductive bands 84.

Figure 14A:
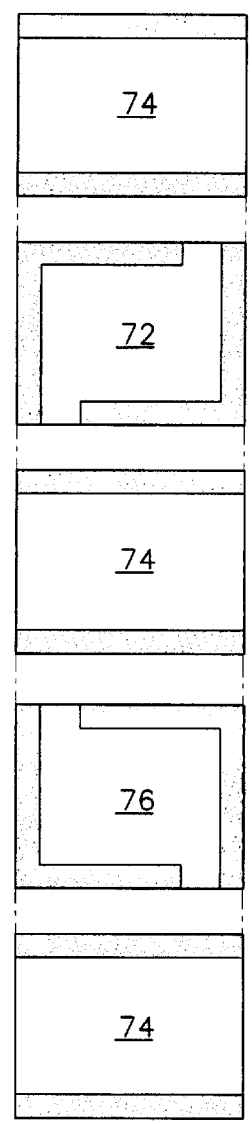
FIG. 14 shows a top plan view of the common conductive electrode shield plates and differential electrode plates which make up an alternate embodiment of the multi-functional energy conditioner placed in a cross-over, feed-through configuration in accordance with the present invention followed by a composite top plan view and a composite side elevation view of the multi-functional energy conditioner.
Figure 14B:
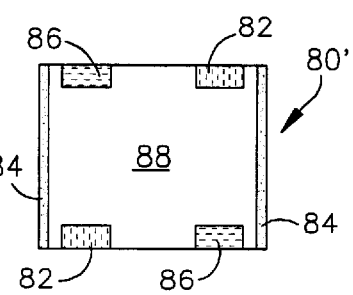
Figure 14C:
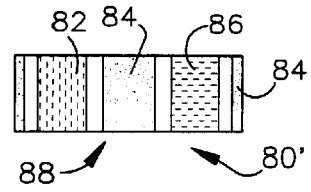

Referring now to FIG. 14, the filter shown 80' is identical to the filter 80 shown in FIG. 13 except that the electrode terminal portion (not numbered) are diagonal to each other in a twisted pair feed thru design.

Referring now to FIGS. 15–18, alternate filter embodiments having multiple filters integrated into one package. It should be understood that any number of individual filters can be incorporated into a single electronic component and that the invention is not limited to two individual filters.

Each of the FIGS. 15–18 show a first dual electrode plate 72A, having a first electrode 72 and a second electrode 76, and a second dual electrode plate 76A, having a first electrode 76 and a second electrode 72, sandwiched between common conductive plates 74A. Each of the electrodes 72, 74, 76 in FIG. 15 and each of the electrodes 72, 76 of FIG. 16 have two electrode termination portions (not numbered) extending through a generally surrounding isolation band of material 88.

Each of the electrodes 72, 74, 76 in FIG. 17 and each of the electrodes 72, 76 of FIG. 18, have one electrode termination portion (not numbered) extending through a generally surrounding isolation band of material 88.

Referring now to FIGS. 15 and 17, the common conductive plates 74A have four common conductive terminals (not numbered) which when connected to common conductive bands 84, provide four places of attachment to external ground areas (not shown) of an electrical circuit system, wherein each common conductive band 84 is about 90 degrees from the next adjacent common conductive band 84.

Additionally, the first and second dual electrode plates 90, 96 have a smaller common conductive plate electrode 74 between the first and second electrode 72 and 76 of each plate 72A and 76A, respectively. This feature provides additional isolation of the dual electrodes.

In an energized system, the invention contains a single shielding, cage-like structure 800" or grouped commonly conductive elements that form extension and/or transformational fusion to its attached an external conductive area 34, will significantly eliminate, reduce and/or suppress E-Fields and H-fields emissions, RF loop radiation, stray capacitances, stray inductances, capacitive parasitics, and at the same time allow for mutual cancellation of oppositely charged or phased and adjacent or abutting electrical fields. The process of electrical energy transmission conditioning is considered a dynamic process over time.

This process can be measured to some degree by devices such as dual port, Time Domain Reflectometry test equipment and/or other industry standard test equipment and fixtures. The invention can also be attached in a single, dual or multi-conductor electrical system with slight modifications made to accommodate external input and output energy transmission conductors or paths for such applications like signal, energy transmission and/or power line decoupling, bypassing and filtering operations. Circuitry and depictions of some of the embodiments shown in this document expose some of the placements contemplated by the applicant and should not be construed as the only possible configurations of the invention elements.

Another aspect of the present invention involves 'decoupling loops' or 'RF loops'. Decoupling loops are related to the perimeter and physical area contained within the current path loop by the physical placement of a passive unit, such as a decoupling capacitor, in relation to its' distance and position between an active component that is receiving the energy that is conditioned from the passive element. In other words, the current loop is the distance and area enclosed by the current path from the power plane to the passive element and the return path to its source (typically on a PCB type board or IC package, etc.).

Power and ground return current pathways which make up an energized loop area are energy transmission lines which at certain frequencies, depending upon the physical size of the loop area of the current pathways, can act as an antenna, radiating unwanted energy from the system. This energized RF loop area creates a state of voltage imbalance in the electrical system because it allows detrimental common mode energy as a by-product of the imbalance that can seriously disrupt and strain efficient energy delivery to active components between an energy source and its subsequent return. The physical size of the RF loop area is directly related to the magnitude of the RF energy that is radiating from the electrical circuit system.

Due to the minute distances between the conductive termination paths to that of each respective differentially conductive energy transmission path the RF loop issue is negated. Voltage balance of the circuit is no longer detrimentally affected as in prior art components or systems.

Figure 19:
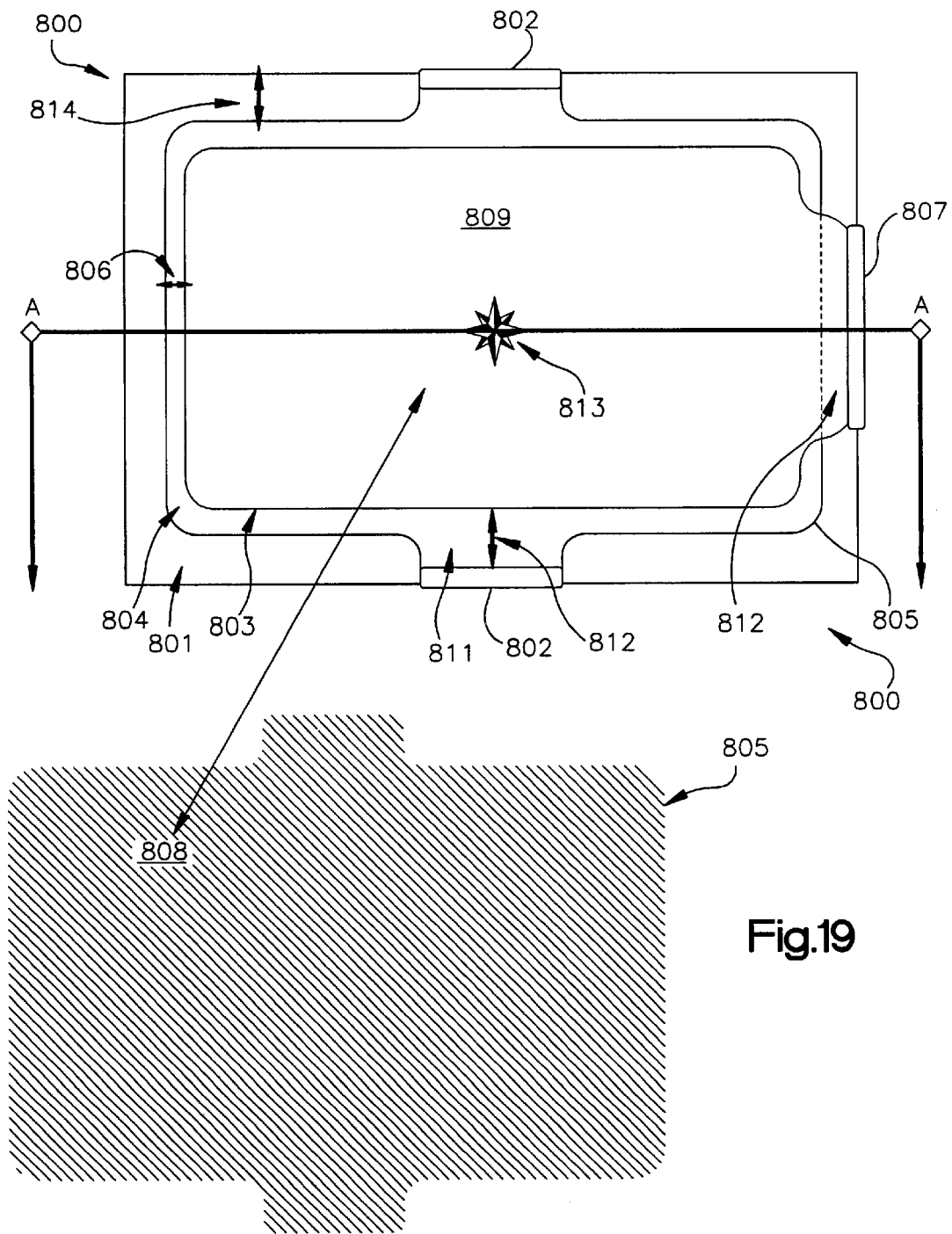
FIG. 19 shows a top plan view of a portion of a Faraday shield-like cage structure in accordance with the present invention having a common conductive plate shown offset to reveal a portion of the Faraday cage architecture including a differential electrode plate.

Referring now to FIG. 19, the Faraday cage-like shield structure 800 or configuration concept of the present invention is shown in detail. A portion of a multi-functional line-conditioning device formed as described for a basic five-layer embodiment will be discussed in more detail. According to the present invention FIG. 19 comprises a portion of the Faraday cage-like structure 800 which consists of two areas of space that sandwiches one of two differential electrodes as more fully described as a whole in FIG. 6A and FIG. 6B of this filing. Conductive electrode plate 809 is sandwiched between central common conductive plate 804 and common conductive plate 808 (shown offset). Common conductive plates 804, 808 and 810 (not shown) are all separated from each other by a general parallel interposition of a predetermined dielectric material and between each outside plate 810 and 808 relative to each plates respect position to the central common conductive plate 804 and differential conductive electrode pathways 809 and 809A (not shown) that feature a differential conductive electrode such as conductive plate 809, almost completely covered or shielded by conductive plates 808 and 804, respectively that are sandwiching conductive plate 809 in this case, above and below, within the invention.

The conductive plates 804, 808, and 810 are also surrounded by dielectric material 801 that provides support and an outer casing of the component. A means to allow connection of both common shield termination structures 802 to the same common conductive plates 808 and 804 and 810 (not shown) individually, is essential and is desired for this embodiment. When the entire invention is placed into circuitry, termination structures 802 should be attached by standard means known in the art to the same external conductive area or to the same external conductive path (not shown) without an interruption or conductive gap between each respective termination structures, 802.

A standard means known in the art facilitates connection of common shield termination structures 802, which attached, respectively, on all three conductive plates 804, 808, and 810 (not shown) together, will form a single structure to act as one common conductive Faraday cage-like shield structure of 800" (not shown).

Although not shown, Faraday cage-like structure 800' (not shown)mirrors single, Faraday cage-like structure 800 (not shown) except that differential electrode 809A (not shown) contained within, is sandwiched and has a exit/entrance section 812A (not shown) that is not fully shielded, but in a generally opposing direction of 180 degrees to that of conductive termination structure 807 and differential electrode 809 to join with conductive termination structure 807A (not shown).

These two Faraday cage-like structures 800 and 800' are in a positioned and parallel relationship, but most importantly, cage-like structures 800 and 800' are sharing the same, central common conductive plate 804, layer or pathway that makes up each Faraday cage-like structures 800 and 800', when taken individually.

Together, Faraday cage-like structures 800 and 800' create a single and larger conductive Faraday cage-like shield structure 800" (not shown) that acts as a double container. Each container 800 and 800' will hold an equal number of same sized, differential electrodes that are opposing one another within said larger structure 800" in a generally parallel manner, respectively. Larger conductive Faraday cage-like shield structure 800" is made with co-acting 800 and 800' individual, shield-like structures when energized, and attached to the same external common conductive path 34, to become one electrically.

At energization, the predetermined arrangement of the common conductive electrodes 804, 808 and 810 (not shown) into a differential conductive sandwich with a centralized common shield 804, are elements that make up one common conductive cage-like shield structure 800", which is the base element of the present invention, namely the Faraday cage-like shield structure 800".

The 800" structure in essence, forms a minimum of two Faraday cage-like structures 800 and 800' that are required to make up a multi-functional line-conditioning device in all of the layered embodiments of the present invention. The central common conductive plate 804 with respect to its interposition between the differential electrodes 809 and 809A (not shown) needs the outer two additional sandwiching common electrode plates 808 and 810 to be considered an un-energized Faraday cage-like shield structure 800".

To go further, the central common plate 804 will be simultaneously used by both differential electrodes 809 and 809A at the same time, but with opposite results, with respective to charge switching. It must be noted that for most chip, non-hole thru embodiments, a new device will have a minimum of two differential electrodes sandwiched between three common conductive electrodes and connected, external termination structures that are connected, and are conductively, as one, to form a single, larger Faraday cage-like shield structure 800" that when attached to a larger external conductive area 34, helps perform simultaneously, energized line conditioning and filtering functions, upon the energy propagating along the conductors sandwich within the said cage-like shield structure 800", in an oppositely phased or charged manner.

The now attached, internal common conductive electrode plates 804, 808 and 810 (not shown) that make up the Faraday cage-like shield structure 800" and their subsequent energization will allow the external conductive area or pathway 34 to become, in essence, an extended and closely positioned and essentially parallel arrangement of conductive elements with respect to its position also located internally within the pre-determined layered PCB or similar electronic circuitry.

Connection of the joined common conductive, and enveloping, multiple, common shield plates 808 and 810 (not shown) with a common centrally located common conductive plate 804 that will be, to external extension elements 34 interposed in such a multiple, parallel manner that the external extension elements will have microns of distance separation or 'loop area' with respect to the complimentary, phased differential electrodes 809 and 809A (not shown) that are sandwiched themselves and yet are separated (not shown) from the external extension 34 by a distance containing a dielectric medium 801 so that said extension becomes an enveloping shield-like element that will perform electrostatic shielding functions, among others, that the said energized combination will enhance and produce efficient, simultaneous conditioning upon the energy propagating on or along said portions of assembly differential conductors. The internal and external parallel arrangement groupings of a combined common conductive planes or areas will also cancel and/or suppress unwanted parasitics, electromagnetic emissions that can escape from or enter upon portions of said differential conductors used by said portions of energy as it propagates along a conductive pathway to active assembly load(s).

In the following sections, reference to common conductive plate 804 also applies to common conductive plates 808 and 810. Common conductive plate 804 is offset a distance 814 from the edge of the invention. One or more portions 811 of the common ground common conductive plate 804 extends 812' through material 801 and is attached to common ground termination band or structure 802. Although not shown, the common ground termination band 802 electrically connects the common conductive plates 804, 808 and 810 to each other, and to all other common conductive plates of the filter, if used.

The conductive electrode plate 809 is not as large as the common conductive plate 804 such that an offset distance and area 806 exists between the edge 803 of the electrode plate 809 and of the edge of the central common conductive plate 804. This offset distance and area 806 enables the common conductive plate 804 to extend beyond the electrode plate 809 to provide a shield against any flux lines which might extend beyond the edge 803 of the electrode plate 809 resulting in reduction or elimination of near field coupling to other electrode plates within the filter or to elements external to the filter.

The horizontal offset is approximately 0 to 20+ times the vertical distance between the electrode plate 809 and the common conductive plate 804, however, the offset distance 806 can be optimized for a particular application but all distances of overlap 806 among each respective plate is ideally approximately the same as manufacturing tolerances will allow. Minor size differences are unimportant in distance/area 806 between plates as long as the electrostatic shielding function of Faraday cage-like shield structure 800" is not compromised. In order to connect electrode 809 to the energy pathways (not shown), the electrode 809 may have one or two portions 812 which extend 812' beyond the edge 805 of the common conductive plates 804 and 808. These portions 812 are connected to electrode termination band 807 which enables the electrode 809 to be electrically connected to the energy pathways (not shown) by solder or the like as previously discussed. It should be noted that element 813 is a dynamic representation of the center axis point of the three-dimensional energy conditioning functions that take place within the invention and is relative with respect to the final size, shape and position of the embodiment in an energized circuit.

As can be seen, many different applications of the multi-functional energy conditioner architecture are possible and review of several features universal to all the embodiments must be noted. First, the material 801 having predetermined electrical properties may be one of a number in any of the embodiments including but not limited to dielectric material, metal oxide varistor material, ferrite material and other more exotic substances such as Mylar film or sintered polycrystalline. No matter which material 801 is used, the combination of common conductive plates and electrode conductive plates creates a plurality of capacitors to form a line-to-line differential coupling capacitor between and two line-to-ground decoupling capacitors from a pair of electrical conductors. The material 801 having electrical properties will vary the capacitance values and/or add additional features such as over-voltage and surge protection or increased inductance, resistance, or a combination of all the above.

Second, in all embodiments whether shown or not, the number of plates, both common conductive and electrode, can be multiplied to create a number of capacitive elements in parallel which thereby add to create increased capacitance values.

Third, additional common conductive plates surrounding the combination of a center conductive plate and a plurality of conductive electrodes are employed to provide an increased inherent ground and optimized Faraday cage-like function and surge dissipation area in all embodiments.

Fourth, although a minimum of one central common conductive shield paired with two additionally positioned common conductive plates or shields are generally desired and should be positioned on opposite sides of the central common conductive shield (other elements such as dielectric material and differential conductive electrodes can be located between these shields as described). Additional common conductive plates can be employed with any of the embodiments shown and is fully contemplated by Applicant.

In fact the multi-functional energy conditioner, although not shown, could easily be fabricated in silicon and directly incorporated into integrated circuits for use in such applications as communication microprocessor integrated circuitry or chips. Integrated circuits are already being made having capacitors etched within the silicone foundation which allows the architecture of the present invention to readily be incorporated with technology available today.

The multi-functional energy conditioner can also be embedded and filter communication or data lines directly from their circuit board terminal connections, thus reducing circuit board real estate requirements and further reducing overall circuit size while having simpler production requirements.

Finally, from a review of the numerous embodiments it should be apparent that the shape, thickness or size may be varied depending on the electrical characteristics desired or upon the application in which the filter is to be used due to the physical architecture derived from the arrangement of common conductive electrode plates and their attachment structures that form at least one single conductively homogenous, Faraday cage-like shield structure 800" and other conductive electrode plates.

Although the principals, preferred embodiments and preferred operation of the present invention have been described in detail herein, this is not to be construed as being limited to the particular illustrative forms disclosed. It will thus become apparent to those skilled in the art that various modifications of the preferred embodiments herein can be made without departing from the spirit or scope of the invention as defined by the appended claims.

What is claimed is:

1. A multi-functional energy conditioner for electrical connection between an energy source and a load comprising:
    at least two differential electrode plates;
    means for electrostatically shielding said differential electrode plates both above and below said differential electrode plates;
    means for preventing direct electrical connection between said differential electrode plates and said means for electrostatically shielding said differential electrode plates; and
    means for conditioning energy propagated from said energy source to said load along at least one conductive pathway.

2. The multi-functional energy conditioner of claim 1, further comprising means for minimizing the loop area between said energy source and said load.

3. The multi-functional energy conditioner of claim 1, further comprising means for simultaneously filtering differential and common mode noise propagated along said at least one conductive pathway.

4. The multi-functional energy conditioner of claim 1, further comprising means for decoupling said energy propagated along said at least one conductive pathway.

5. The multi-functional energy conditioner of claim 1, further comprising means for protecting said energy source and said load from energy surges.

6. The multi-functional energy conditioner of claim 1, further comprising means for partially suppressing parasitics.

7. A multi-functional energy conditioner comprising:
    at least two Faraday cage-like structures stacked on top of each other in a substantially parallel relationship, wherein each Faraday cage-like structure comprises;
    a differential electrode plate;
    at least two common ground conductive plates;
    wherein said differential electrode plate is sandwiched in a substantially parallel relationship between said at least two common ground conductive plates;
    a material having predetermined electrical properties, wherein said material is maintained between said at least two common ground conductive plates and said differential electrode plate preventing direct electrical connection between said plates;
    wherein said at least at least two common ground conductive plates are electrically connected to each other; and
    wherein between each of said Faraday cage-like structures, said common ground conductive plates are shared and form at least one central common ground conductive plate.

8. The multi-functional energy conditioner of claim 7, wherein said differential electrode plate of each of said Faraday cage-like structures is smaller than said at least two common ground conductive plates which sandwich said differential electrode plate.

9. The multi-functional energy conditioner of claim 7, wherein each of said Faraday cage-like structures further comprise at least a second differential electrode plate in a co-planar relationship with said first differential electrode plate electrically separated from each other by said material.

10. The multi-functional energy conditioner of claim 7, wherein said differential electrode plate of each of said Faraday cage-like structure comprises at least two terminal portions where energy can enter and exit said differential electrode plate and cross over at an angle to energy propagating through said differential electrode plate of each of said Faraday cage-like structure.

11. The multi-functional energy conditioner of claim 7 in which said differential electrode plates of said at least two Faraday cage-like structures are generally the same size and isolated from each other by said at least one central common ground conductive plate by predetermined arrangement and wherein each differential electrode plate of said at least two Faraday cage-like structures is positioned and aligned by at least predetermined arrangement to be an oppositely oriented differential electrode plate relative to at least the nearest differential electrode plate of said at least two Faraday cage-like structures.

12. The multi-functional energy conditioner of claim 11 in which said first Faraday cage-like structure of said at least two Faraday cage-like structures and said second Faraday cage-like structure of said at least two Faraday cage-like structures are the same size; and wherein said first differential electrode plate of said first Faraday cage-like structure of said at least two Faraday cage-like structures and said second differential electrode plate of said second Faraday cage-like structure of said at least two Faraday cage-like structures are at least generally smaller than at least any one common ground conductive plate of said at least two common ground conductive plates of said first Faraday cage-like structure of said at least two Faraday cage-like structures and at least generally smaller than at least any one common ground conductive plate of said at least two common ground conductive plates of said second Faraday cage-like structure of said at least two Faraday cage-like structures.

13. The multi-functional energy conditioner of claim 12, in which said multi-functional energy conditioner is practicable for simultaneous electrostatic shielding of both said first differential electrode plate of said first Faraday cage-like structure of said at least two Faraday cage-like structures and said second differential electrode plate of said second Faraday cage-like structure of said at least two Faraday cage-like structures when said multi-functional energy conditioner is selectively coupled into a circuit and energized.

14. The multi-functional energy conditioner of claim 12, wherein the integer number of the sum total of all of said differential electrode plates and all of said common electrode plates comprising all of said at least two Faraday cage-like structures is an odd integer number.

15. The multi-functional energy conditioner of claim 14, wherein the integer number of the sum total of all of said at least two Faraday cage-like structures is an even integer number.

16. The multi-functional energy conditioner of claim 12, wherein said multi-functional energy conditioner is arranged to define at least a feedthru capacitor array.

17. The multi-functional energy conditioner of claim 15, wherein said multi-functional energy conditioner is arranged to define at least a bypass capacitor.

18. The multi-functional energy conditioner of claim 12, wherein said multi-functional energy conditioner is arranged to define at least a cross-over feedthru capacitor array.

19. The multi-functional energy conditioner of claim 12, wherein said multi-functional energy conditioner is arranged to define at least a bypass capacitor array.

* * * * *

UNITED STATES PATENT AND TRADEMARK OFFICE
CERTIFICATE OF CORRECTION

PATENT NO.    : 6,373,673 B1
DATED         : April 16, 2002
INVENTOR(S)   : Anthony A. Anthony and William M. Anthony It is certified that error appears in the above-identified patent and that said Letters Patent is hereby corrected as shown below:

<u>Title page,</u>
Item [75], Inventor, replace "Anthony A. Anthony, Erie, PA (US)" with
-- Anthony A. Anthony, Erie, PA (US) and William M. Anthony, Erie, Pa (US) --

Signed and Sealed this

Twenty-fourth Day of September, 2002

*Attest:*

*Attesting Officer*

JAMES E. ROGAN
*Director of the United States Patent and Trademark Office*

UNITED STATES PATENT AND TRADEMARK OFFICE
CERTIFICATE OF CORRECTION

PATENT NO.    : 6,373,673 B1
DATED         : April 16, 2002
INVENTOR(S)   : Anthony A. Anthony It is certified that error appears in the above-identified patent and that said Letters Patent is hereby corrected as shown below:

<u>Title page,</u>
Item [63], should read as follows:
-- [63]  Continuation-in-part of application No. 09/600,530, filed as application No. PCT/US99/01040 on Jan. 16, 1999, application No. 09/579,606, is also a continuation-in-part of application No. 09/460,218, filed on Dec. 13, 1999, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8,1997, now Pat. No. 5,909,350. --

Signed and Sealed this

Twenty-seventh Day of April, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,373,673 B1 Page 1 of 1
APPLICATION NO. : 09/579606
DATED : April 16, 2002
INVENTOR(S) : Anthony A. Anthony It is certified that error appears in the above-identified patent and that said Letters Patent is hereby corrected as shown below:

Title Page Item (63)
--Continuation-in-part of application No. 09/600,530, which is a US national stage application of international application PCT/US99/01040 filed on Jan. 16, 1999, which is a continuation-in-part of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350; and application No. 09/579,606 is also a continuation-in-part of application No. 09/460,218, filed on Dec. 13, 1999, now U.S. Pat. No. 6,331,926, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.--

Signed and Sealed this

Twenty-sixth Day of February, 2008

JON W. DUDAS
*Director of the United States Patent and Trademark Office*

UNITED STATES PATENT AND TRADEMARK OFFICE
CERTIFICATE OF CORRECTION

PATENT NO. : 6,373,673 B1
APPLICATION NO. : 09/579606
DATED : April 16, 2002
INVENTOR(S) : Anthony A. Anthony It is certified that error appears in the above-identified patent and that said Letters Patent is hereby corrected as shown below:

Title Page Item (63) should read
--Continuation-in-part of application No. 09/600,530, which is a US national stage application of international application PCT/US99/01040 filed on Jan. 16, 1999, which is a continuation-in-part of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350; and application No. 09/579,606 is also a continuation-in-part of application No. 09/460,218, filed on Dec. 13, 1999, now U.S. Pat. No. 6,331,926, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.--

The first sentence of the specification, Column 1 lines 4-15 reading "This application is a continuation-in-part of co-pending application Ser. No. 09/600,530 filed Jul. 18, 2000, which is a U.S. national stage application of international application PCT/US99/01040 filed Jan. 16, 1999; this application is also a continuation-in-part of co-pending application Ser. No. 09/460,218 filed Dec. 13, 1999, which is a continuation of application Ser. No. 09/056,379 filed Apr. 7, 1998, now issued as U.S. Pat. No. 6,018,448, which is a continuation-in-part of application Ser. No. 09/008,769 filed Jan. 19, 1998, now issued as U.S. Pat. No. 6,097,581, which is a continuation-in-part of application Ser. No. 08/841,940 filed Apr. 8, 1997, now issued as U.S. Pat. No. 5,909,350." should read:

UNITED STATES PATENT AND TRADEMARK OFFICE
CERTIFICATE OF CORRECTION

PATENT NO. : 6,373,673 B1
APPLICATION NO. : 09/579606
DATED : April 16, 2002
INVENTOR(S) : Anthony A. Anthony It is certified that error appears in the above-identified patent and that said Letters Patent is hereby corrected as shown below:

--This application is a continuation-in-part of application No. 09/600,530, which is a US national stage application of international application PCT/US99/01040 filed on Jan. 16, 1999, which is a continuation-in-part of application No. 09/056,379, filed on Apr. 7, 1998, now Pat. No. 6,018,448, which is a continuation-in-part of application No. 09/008,769, filed on Jan. 19, 1998, now Pat No. 6,097,581, which is a continuation-in-part of application No. 08/841,940, filed on Apr. 8, 1997, now Pat. No. 5,909,350; and this application is also a continuation-in-part of application No. 09/460,218, filed on Dec. 13, 1999, now U.S. Pat. No. 6,331,926, which is a continuation of application No. 09/056,379, filed on Apr. 7, 1998, now Pat. No. 6,018,448, which is a continuation-in-part of application No. 09/008,769, filed on Jan. 19, 1998, now Pat. No. 6,097,581, which is a continuation-in-part of application No. 08/841,940, filed on Apr. 8, 1997, now Pat. No. 5,909,350.--

This certificate supersedes the Certificates of Correction issued April 27, 2004 and February 26, 2008.

Signed and Sealed this

Thirty-first Day of March, 2009

JOHN DOLL
*Acting Director of the United States Patent and Trademark Office*